US009799657B2

(12) United States Patent
Noh et al.

(10) Patent No.: US 9,799,657 B2
(45) Date of Patent: Oct. 24, 2017

(54) METHOD OF MANUFACTURING A THREE-DIMENSIONAL SEMICONDUCTOR MEMORY DEVICE

(71) Applicants: Jintae Noh, Yongin-si (KR); Bio Kim, Seoul (KR); Su-Jin Shin, Osan-si (KR); Hanvit Yang, Suwon-si (KR); Kihyun Hwang, Seongnam-si (KR)

(72) Inventors: Jintae Noh, Yongin-si (KR); Bio Kim, Seoul (KR); Su-Jin Shin, Osan-si (KR); Hanvit Yang, Suwon-si (KR); Kihyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/302,032

(22) PCT Filed: Jun. 23, 2014

(86) PCT No.: PCT/IB2014/062525
§ 371 (c)(1),
(2) Date: Oct. 5, 2016

(87) PCT Pub. No.: WO2015/198088
PCT Pub. Date: Dec. 30, 2015

(65) Prior Publication Data
US 2017/0162578 A1  Jun. 8, 2017

(51) Int. Cl.
*H01L 21/033* (2006.01)
*H01L 27/105* (2006.01)
(Continued)

(52) U.S. Cl.
CPC .... *H01L 27/1052* (2013.01); *H01L 21/02323* (2013.01); *H01L 21/02532* (2013.01);
(Continued)

(58) Field of Classification Search
CPC ......... H01L 21/02323; H01L 21/02595; H01L 21/0332; H01L 21/02532; H01L 27/1052; H01L 29/401
See application file for complete search history.

(56) References Cited

U.S. PATENT DOCUMENTS 7,927,953 B2   4/2011   Ozawa
8,048,743 B2  11/2011   Lee et al.
(Continued)

FOREIGN PATENT DOCUMENTS

KR    20130005435 A    1/2013

OTHER PUBLICATIONS

International Search Report PCT/ISA/210 for International Application No. PCT/IB2014/062525 dated Mar. 24, 2015.

*Primary Examiner* — Kyoung Lee
*Assistant Examiner* — Christina Sylvia
(74) *Attorney, Agent, or Firm* — Harness, Dickey & Pierce, P.L.C.

(57) ABSTRACT

The inventive concepts provide methods of manufacturing a semiconductor device. The method includes forming a thin layer structure including insulating layers and sacrificial layers alternately and repeatedly stacked on a substrate, forming a through-hole penetrating the thin layer structure and exposing the substrate, forming a semiconductor layer covering an inner sidewall of the through-hole and partially filling the through-hole, oxidizing a first portion of the semiconductor layer to form a first insulating layer, and injecting oxygen atoms into a second portion of the semiconductor layer. An oxygen atomic concentration of the second portion is lower than that of the first insulating layer. Oxidizing the first portion and injecting the oxygen atoms into the second portion are performed using an oxidation process at the same time.

15 Claims, 20 Drawing Sheets

(51) Int. Cl.
*H01L 21/02* (2006.01)
*H01L 21/311* (2006.01)
*H01L 29/40* (2006.01)

(52) U.S. Cl.
CPC .... *H01L 21/02595* (2013.01); *H01L 21/0332* (2013.01); *H01L 21/31144* (2013.01); *H01L 29/401* (2013.01)

(56) References Cited

U.S. PATENT DOCUMENTS

| | | |
|---|---|---|
| 8,399,323 B2 | 3/2013 | Lee et al. |
| 8,410,538 B2 | 4/2013 | Ishiduki et al. |
| 8,426,302 B2 | 4/2013 | Matsushita et al. |
| 8,445,347 B2 | 5/2013 | Alsmeier |
| 8,461,000 B2 | 6/2013 | Alsmeier et al. |
| 8,697,524 B2 | 4/2014 | You et al. |
| 8,841,183 B2 | 9/2014 | Ozawa |
| 8,946,021 B2 | 2/2015 | Ozawa |
| 2010/0140684 A1 | 6/2010 | Ozawa |
| 2010/0317166 A1 | 12/2010 | Lee et al. |
| 2011/0156131 A1 | 6/2011 | Ozawa |
| 2012/0021574 A1 | 1/2012 | Lee et al. |
| 2012/0037977 A1 | 2/2012 | Lee et al. |
| 2012/0058629 A1 | 3/2012 | You et al. |
| 2012/0142180 A1* | 6/2012 | Matsushita ........ G11C 16/0466 438/591 |
| 2012/0153291 A1 | 6/2012 | Kim et al. |
| 2012/0295409 A1 | 11/2012 | Yun et al. |
| 2013/0130454 A1 | 5/2013 | Lee et al. |
| 2013/0134492 A1 | 5/2013 | Yang et al. |
| 2013/0137228 A1 | 5/2013 | Lee et al. |
| 2013/0171787 A1 | 7/2013 | Jeon et al. |
| 2014/0070302 A1 | 3/2014 | Yoo et al. |
| 2014/0193966 A1 | 7/2014 | You et al. |
| 2014/0357032 A1 | 12/2014 | Ozawa |

* cited by examiner

METHOD OF MANUFACTURING A THREE-DIMENSIONAL SEMICONDUCTOR MEMORY DEVICE

CROSS-REFERENCE TO RELATED APPLICATIONS

This application is the U.S. National Phase application of PCT Application No. PCT/IB2014/062525 filed on Jun. 23, 2014, the entire contents of each of which are incorporated herein by reference.

TECHNICAL FIELD

The inventive concepts relate to methods of manufacturing a semiconductor device and, more particularly, to methods of manufacturing a three-dimensional semiconductor memory device including memory cells that are three-dimensionally arranged.

BACKGROUND ART

Semiconductor devices have been highly integrated to satisfy consumer demands for superior performance and inexpensive prices for electronic devices. In the case of semiconductor devices, since their integration degree is an important factor in determining product price, increased integration is especially desired. The integration level of typical two-dimensional or planar semiconductor memory devices is primarily determined by the area occupied by a unit memory cell. Accordingly, in such devices, integration is greatly influenced by the level of fine pattern forming technology used in their manufacture. However, the extremely expensive processing equipments needed for increasing pattern fineness may set a practical limitation on increasing integration for two-dimensional or planar semiconductor devices.

To overcome such a limitation, three-dimensional semiconductor memory devices having three-dimensionally arranged memory cells have been proposed. However, new process technologies capable of reducing manufacture costs and improving reliability should be developed in order to mass produce three-dimensional semiconductor memory devices.

DISCLOSURE

Technical Problem

Embodiments of the inventive concepts may provide methods of manufacturing a semiconductor device having improved channel characteristics.

Technical Solution

According to example embodiments of the inventive concepts, a method of manufacturing a semiconductor device may include: forming a thin layer structure including insulating layers and sacrificial layers which are alternately and repeatedly stacked on a substrate; forming a through-hole penetrating the thin layer structure and exposing the substrate; forming a semiconductor layer covering an inner sidewall of the through-hole, the semiconductor layer partially filling the through-hole; oxidizing a first portion of the semiconductor layer to form a first insulating layer; and injecting oxygen atoms into a second portion of the semiconductor layer. An oxygen atomic concentration of the second portion may be lower than an oxygen atomic concentration of the first insulating layer. Oxidizing the first portion and injecting the oxygen atoms into the second portion may be performed using an oxidation process at the same time.

In some embodiments, the second portion of the semiconductor layer, which is injected with the oxygen atoms, may have a higher electrical conductivity than the first insulating layer.

In some embodiments, the semiconductor layer may include a poly-crystalline semiconductor material, and the oxygen atoms may be injected into a grain boundary of the poly-crystalline semiconductor material.

In some embodiments, the semiconductor layer may be a poly-crystalline silicon layer, and the oxygen atoms may be combined with silicon atoms at a grain boundary in the poly-crystalline silicon layer.

In some embodiments, the oxygen atomic concentration of the second portion may be in a range of about $10^{18}/cm^3$ to about $10^{20}/cm^3$.

In some embodiments, the oxidation process may be a radical oxidation process performed at a temperature in a range of about 600° C. to about 1000° C.

In some embodiments, the oxidation process may be a wet oxidation process performed at a temperature in a range of about 800° C. to about 1000° C.

In some embodiments, the method may further include: forming a first semiconductor pattern between the inner sidewall of the through-hole and the semiconductor layer; forming a second insulating layer filling a rest region of the through-hole after performing the oxidation process; and planarizing the second insulating layer, the first insulating layer and the second portion of the semiconductor layer to form a second semiconductor pattern, a first insulating pattern and a second insulating pattern in the through-hole at the same time.

In some embodiments, the method may further include: injecting oxygen atoms into the first semiconductor pattern. Injecting the oxygen atoms into the second portion of the semiconductor layer and injecting the oxygen atoms into the first semiconductor pattern may be performed using the oxidation process at the same time.

In some embodiments, an oxygen atomic concentration of the first semiconductor pattern may be lower than the oxygen atomic concentration of the first insulating layer.

In some embodiments, the oxygen atomic concentration of the first semiconductor pattern may be substantially equal to the oxygen atomic concentration of the second portion of the semiconductor layer.

In some embodiments, the first semiconductor pattern injected with the oxygen atoms may have a higher electrical conductivity than the first insulating layer.

In some embodiments, the first semiconductor pattern may include a poly-crystalline semiconductor material, and the oxygen atoms may be injected into a grain boundary of the poly-crystalline semiconductor material of the first semiconductor pattern.

In some embodiments, the method may further include: forming a lower semiconductor pattern filling a lower region of the through-hole. The first semiconductor pattern, the second semiconductor pattern, the first insulating pattern and the second insulating pattern may be formed in an upper region of the through-hole on the lower semiconductor pattern, and the first and second semiconductor patterns may be defined as an upper semiconductor pattern.

In some embodiments, the method may further include: patterning the thin layer structure to form a trench that is spaced apart from the through-hole and exposes the substrate; removing the sacrificial layers exposed by the trench to form recess regions; and forming gate electrodes in the recess regions, respectively. The first and second semiconductor patterns may include channel regions controlled by the gate electrodes.

Advantageous Effects

According to embodiments of the inventive concepts, the oxidation process may be performed on the semiconductor layer including the poly-crystalline semiconductor material. Thus, the first portion of the semiconductor layer may be oxidized to form the first insulating layer, and at the same time, the oxygen atoms may be injected into the second portion of the semiconductor layer. The oxygen atoms may be injected to a grain boundary of the poly-crystalline semiconductor material in the second portion, so that the oxygen atoms may be combined with the main atoms of the semiconductor material adjacent to the grain boundary, thereby reducing defects (e.g., dangling bonds between the main atoms) caused at the grain boundary. Thus, it is possible to provide the 3D semiconductor memory device having improved channel characteristics (e.g., an improved cell current characteristic).

MODE FOR INVENTION

Figure 1:
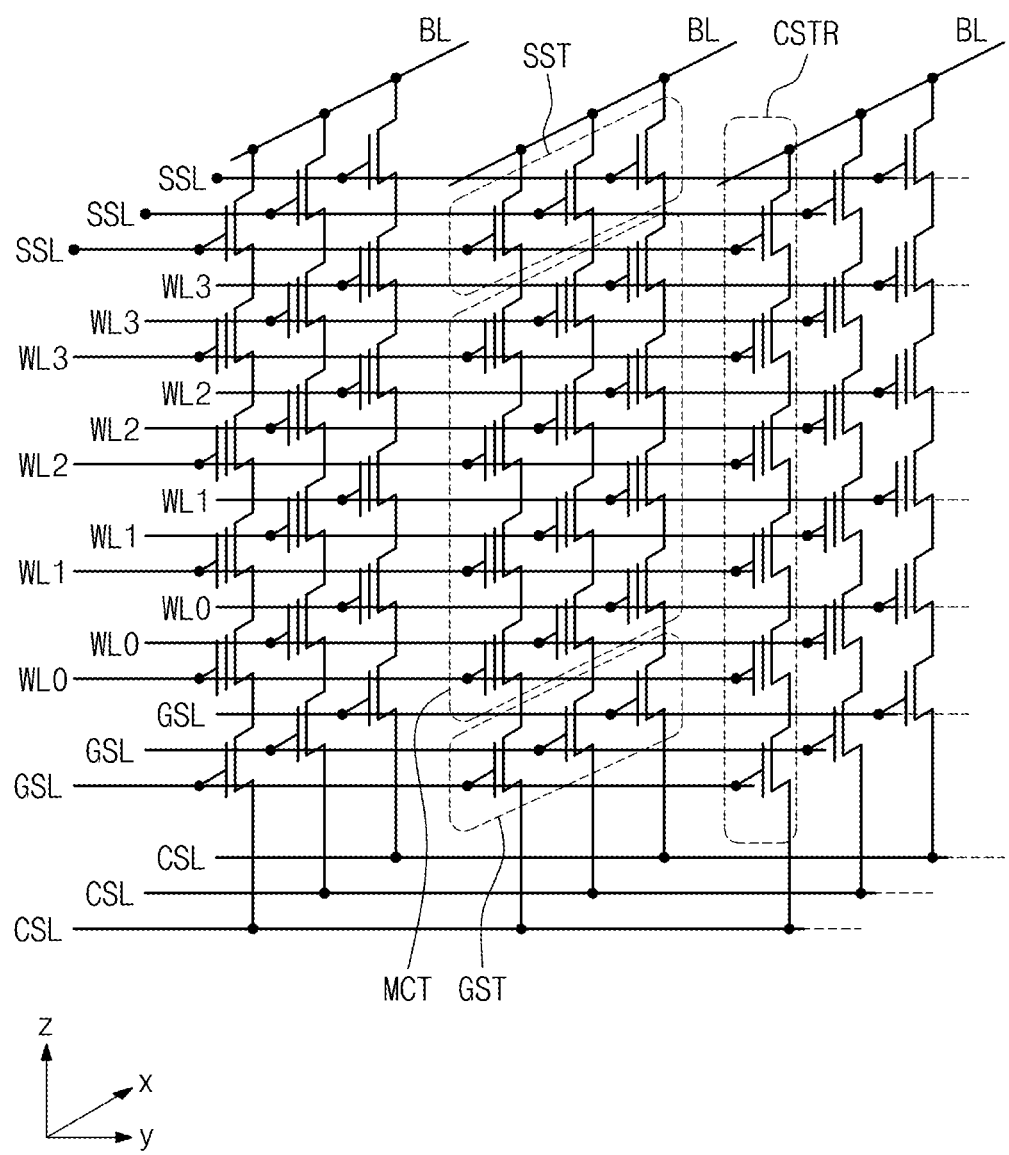
FIG. 1 is a schematic circuit diagram illustrating a cell array of a three-dimensional semiconductor memory device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings.

It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

FIG. 1 is a schematic circuit diagram illustrating a cell array of a three-dimensional semiconductor memory device according to example embodiments of the inventive concepts.

Referring to FIG. 1, a cell array of a three-dimensional (3D) semiconductor memory device according to some embodiment may include a common source line CSL, a plurality of bit lines BL and a plurality of cell strings CSTR disposed between the common source line CSL and the bit lines BL.

The common source line CSL may be a conductive layer disposed on a substrate, or a dopant region formed in the substrate. The bit lines BL may be conductive patterns (e.g., metal lines) spaced apart upward from the substrate. The bit lines BL may be two-dimensionally arranged when viewed from a plan view. A plurality of cell strings CSTR may be connected in parallel to each bit line BL. The cell strings CSTR may be connected in common to the common source line CSL. In other words, a plurality of cell strings CSTR may be disposed between the common source line CSL and the plurality of bit lines BL. In some embodiments, the common source line CSL may be provided in plural, and the plurality of common source lines CSL may be two-dimensionally arranged. Here, the common source lines CSL may be applied with the same voltage. Alternatively, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series to each other.

The common source line CSL may be connected in common to sources of the ground selection transistors GST. A ground selection line GSL, a plurality of word lines WL0 to WL3 and a plurality of string selection lines SSL, which are disposed between the common source line CSL and the bit lines BL, may be used as gate electrodes of the ground selection transistor GST, the memory cell transistors MCT and the string selection transistors SST, respectively. Each of the memory cell transistors MCT includes a data storage element.

Figure 4:
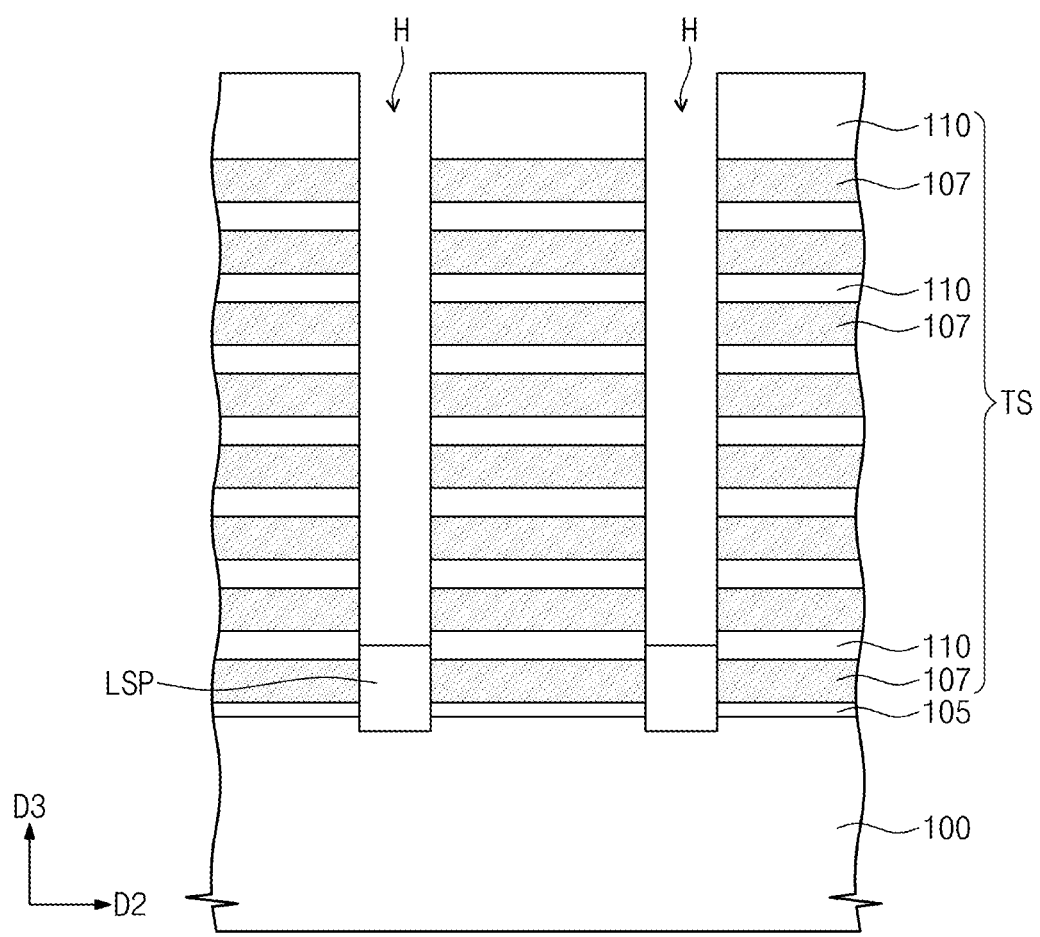
Figure 5:
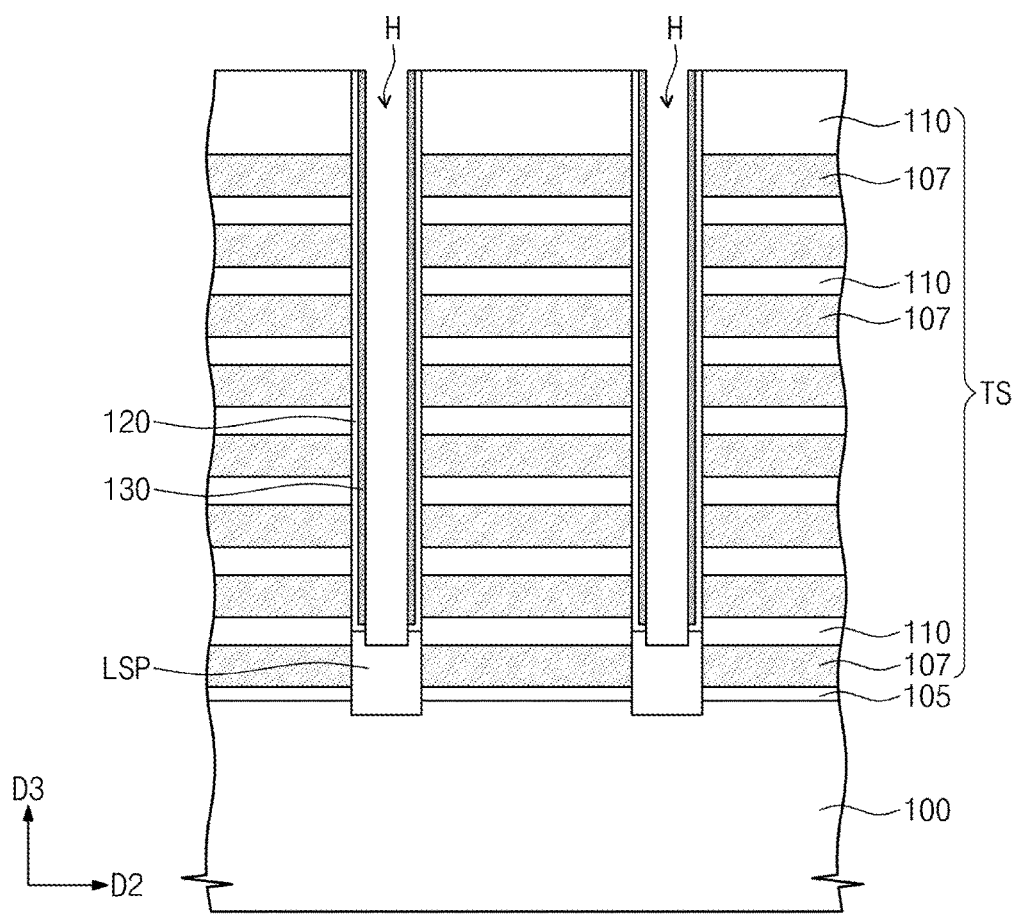
Figure 6:
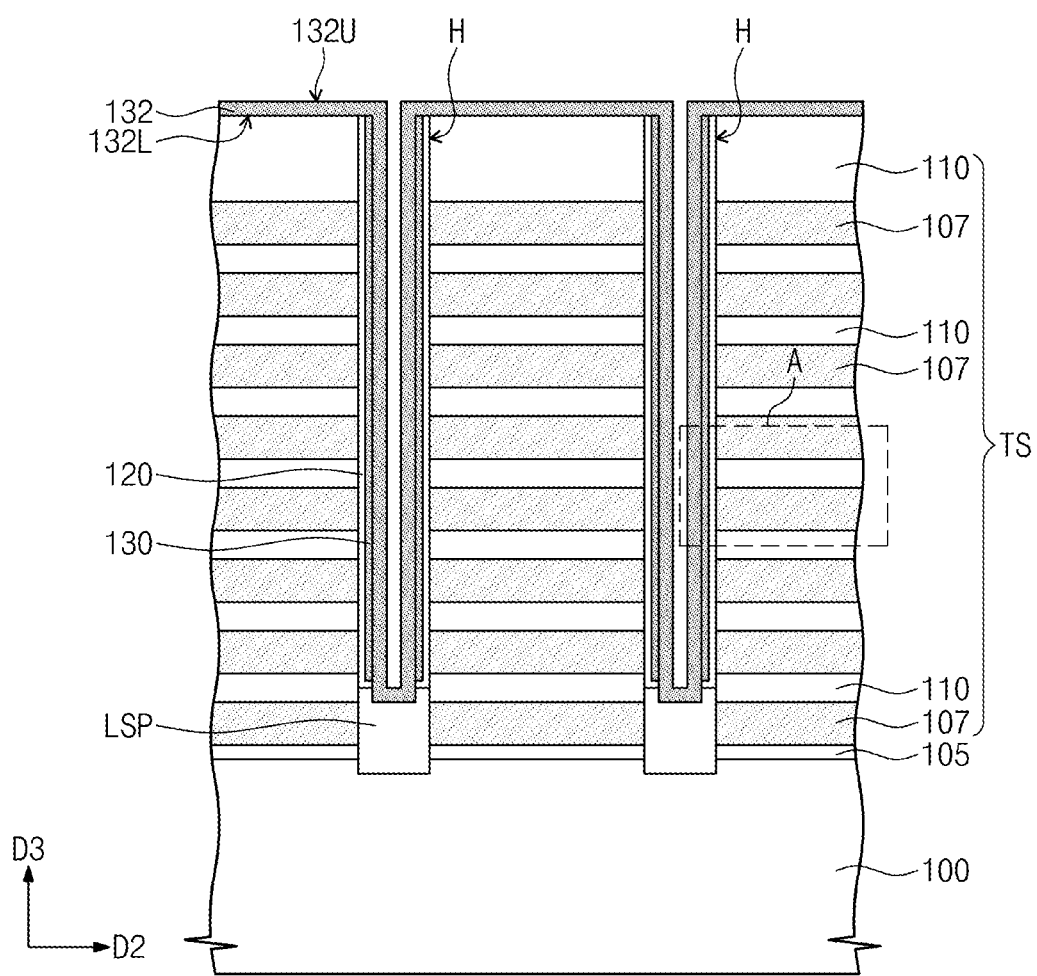
Figure 14:
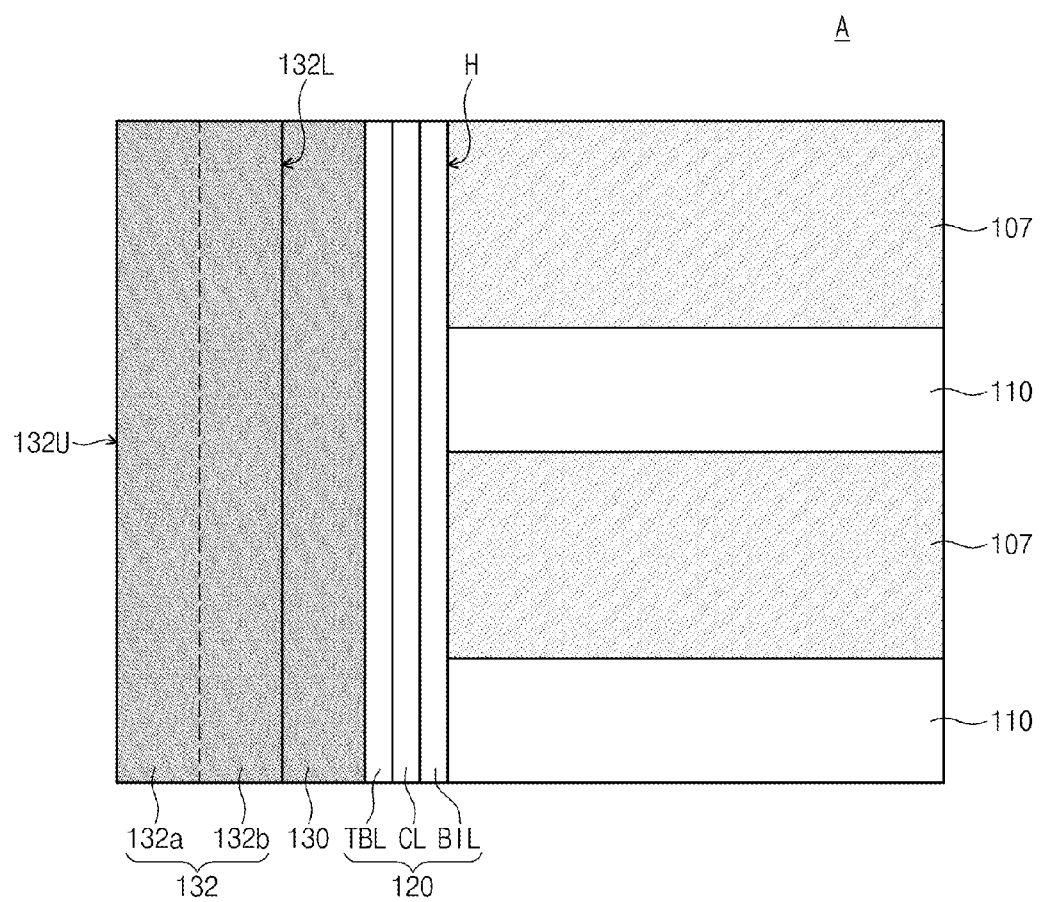
FIG. 14 is an enlarged view of a portion 'A' of FIG. 6.
Figure 15:
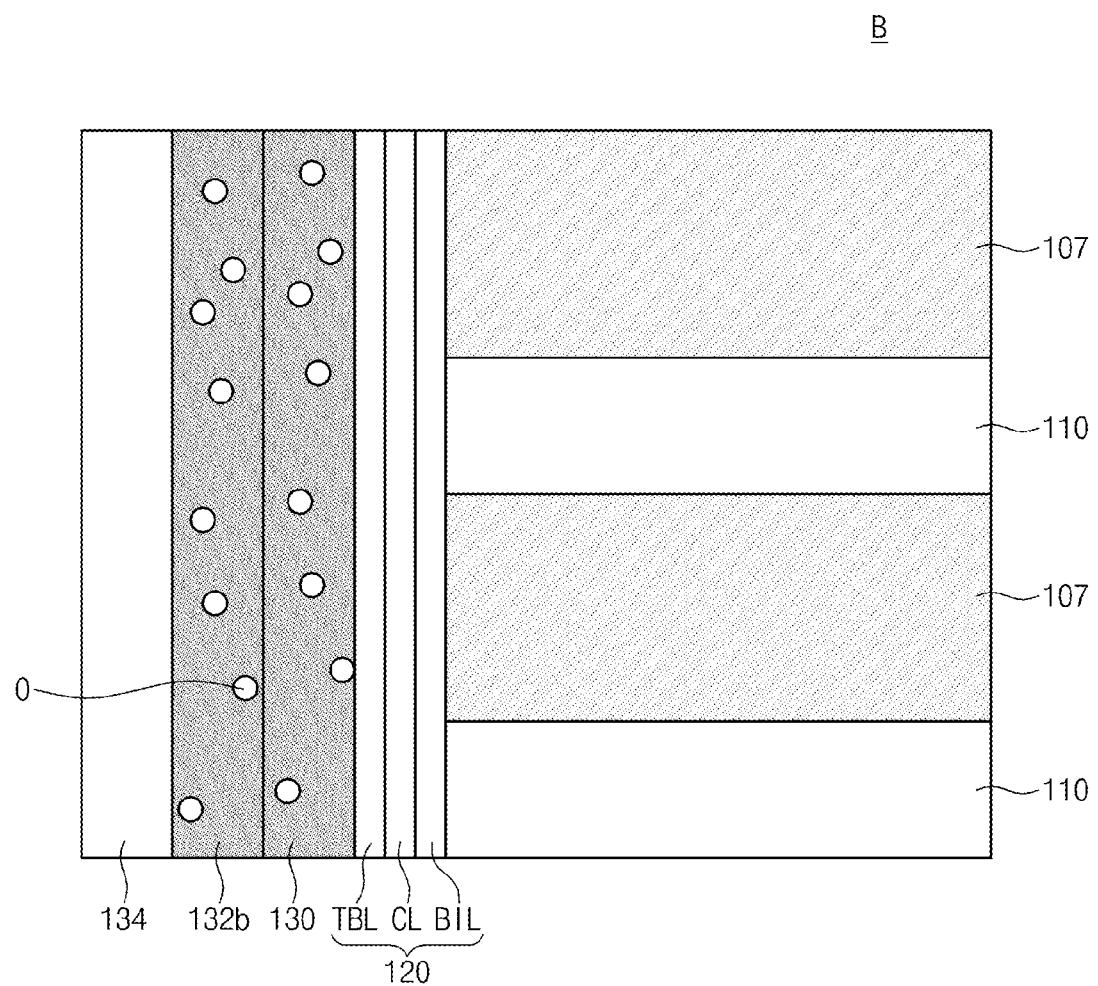
FIG. 15 is an enlarged view of a portion 'B' of FIG. 7.

FIGS. 2 to 13 are cross-sectional views illustrating a method of manufacturing a three-dimensional semiconductor memory device according to example embodiments of the inventive concepts. FIG. 14 is an enlarged view of a portion 'A' of FIG. 6, and FIG. 15 is an enlarged view of a portion 'B' of FIG. 7.

Figure 2:
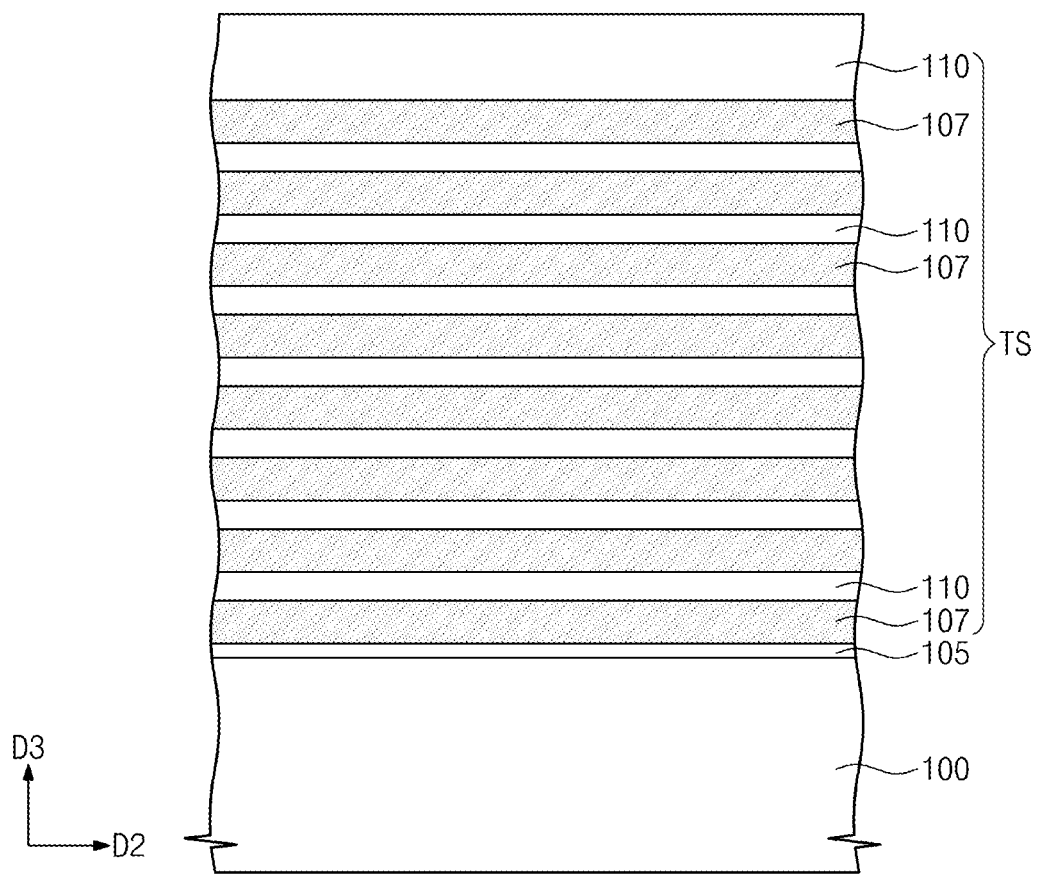
FIGS. 2 to 13 are cross-sectional views illustrating a method of manufacturing a three-dimensional semiconductor memory device according to example embodiments of the inventive concepts.

Referring to FIG. 2, a lower insulating layer 105 may be formed on a substrate 100. The substrate 100 may be, for example, a silicon substrate, a germanium substrate or a silicon-germanium substrate. In some embodiments, the lower insulating layer 105 may be a silicon oxide layer formed by a thermal oxidation process or a silicon oxide layer formed using a deposition technique.

Sacrificial layers 107 and insulating layers 110 may be alternately and repeatedly deposited on the lower insulating layer 105 to form a thin layer structure TS.

The sacrificial layers 107 may be formed of a material having an etch selectivity with respect to the insulating layers 110. In some embodiments, the etch selectivity between the sacrificial layers 107 and the insulating layers 110 may be great in a wet etching process using a chemical solution but may be little in a dry etching process using an etching gas.

In some embodiments, thicknesses of the sacrificial layers 107 may be equal to each other. In other embodiments, the lowermost one and the uppermost one of the sacrificial layers 107 may be thicker than the sacrificial layers 107 therebetween. The insulating layers 110 may have the same thickness. Alternatively, at least one of the insulating layers 110 may have a thickness different from those of others of the insulating layers 110. The lower insulating layer 105 may be thinner than the sacrificial layers 107 and the insulating layer 110 disposed on the lower insulating layer 105.

The sacrificial layers 107 and the insulating layers 110 may be formed using, for example, a thermal chemical vapor deposition (thermal CVD) process, a plasma-enhanced CVD process, a physical CVD process, or an atomic layer deposition (ALD) process.

As described above, the sacrificial layers 107 may have the etch selectivity with respect to the insulating layers 110. For example, the sacrificial layers 107 may include at least one of silicon, silicon oxide, silicon carbide, silicon oxynitride, and silicon nitride. The insulating layers 110 may include at least one of silicon, silicon oxide, silicon carbide, silicon oxynitride, and silicon nitride. Here, the insulating layers 110 are formed of a different material from the sacrificial layers 107. In some embodiments, the sacrificial layers 107 may be silicon nitride layers, and the insulating layers 110 may be silicon oxide layers. In other embodiments, the sacrificial layers 107 may be formed of a conductive material, and the insulating layers 110 may be formed of an insulating material.

Figure 3:
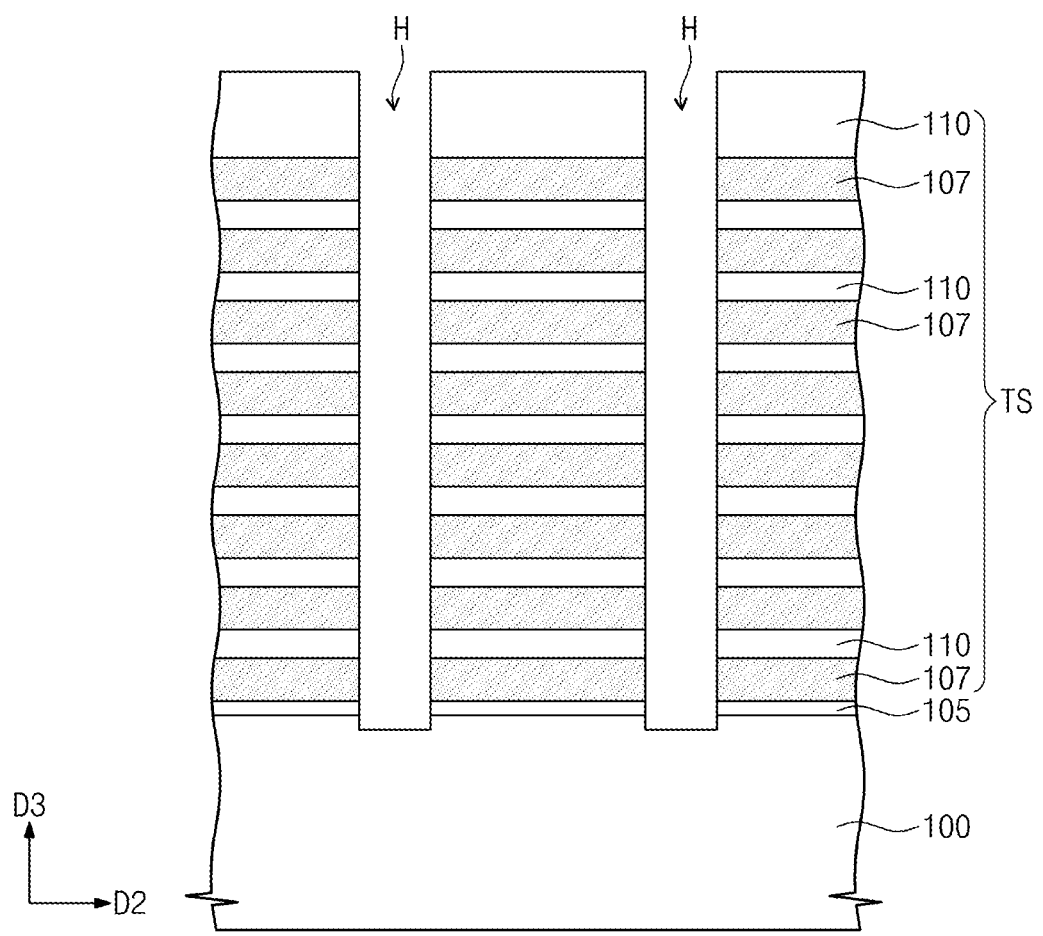
Figure 17:
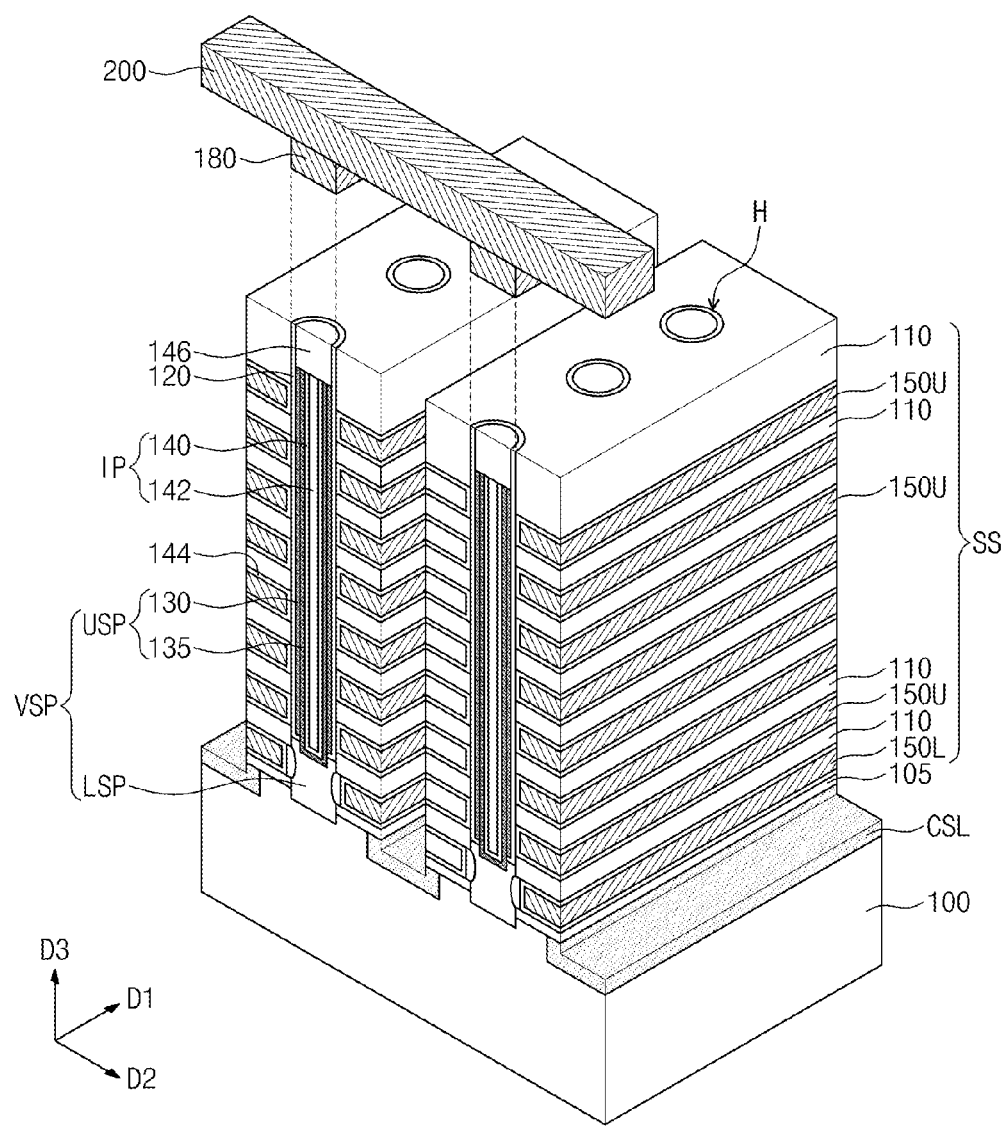
FIG. 17 is a perspective view illustrating a three-dimensional semiconductor memory device according to example embodiments of the inventive concepts.

Referring to FIG. 3, through-holes H may be formed to penetrate the thin layer structure TS. The through-holes H may expose the substrate 100. The through-holes H may be two-dimensionally arranged when viewed from a plan view, as illustrated in FIG. 17. In some embodiments, a plurality of the through-holes H may be arranged in a line along one direction. In other embodiments, a plurality of the through-holes H may be arranged in a zigzag form along the one direction unlike FIG. 17.

A first mask pattern having openings may be formed on the thin layer structure TS. The openings of the first mask pattern may define the through-holes H. The thin layer structure TS may be anisotropically etched using the first mask pattern as an etch mask, thereby forming the through-holes H. The first mask pattern may be formed of a material having an etch selectivity with respect to the sacrificial layers 107 and the insulating layers 110. A top surface of the substrate 100 under the through-holes H may be over-etched by the etching process, so that the substrate 100 under the through-holes H may be recessed.

Referring to FIG. 4, a lower semiconductor pattern LSP may be formed to fill a lower region of each of the through-holes H. The lower semiconductor pattern LSP may be formed by performing a selective epitaxial growth (SEG) process using the substrate 100 exposed by the through-hole H as a seed. In some embodiments, the lower semiconductor pattern LSP may have a pillar-shape filling the lower region of the through-hole H. In some embodiments, the lower semiconductor pattern LSP may cover a sidewall of at least one of the sacrificial layers 107. A top surface of the lower semiconductor pattern LSP may be disposed at a level between the sacrificial layers 107 vertically adjacent to each other.

The lower semiconductor pattern LSP may have a single-crystalline structure or a poly-crystalline structure. For example, the lower semiconductor pattern LSP may include silicon. However, the inventive concepts are not limited thereto. In other embodiments, the lower semiconductor pattern LSP may include at least one of carbon nano structures, organic semiconductor materials and compound semiconductor materials.

The lower semiconductor pattern LSP may have the same conductivity type as the substrate 100. The lower semiconductor pattern LSP may be doped with dopants in-situ during the SEG process. Alternatively, after the lower semiconductor pattern LSP is formed, dopant ions may be implanted into the lower semiconductor pattern LSP.

Referring to FIG. 5, a vertical insulator 120 and a first semiconductor pattern 130 may be formed to cover an inner sidewall of each through-hole H having the lower semiconductor pattern LSP. The vertical insulator 120 and the first semiconductor pattern 130 expose the lower semiconductor pattern LSP.

In more detail, a vertical insulating layer and a first semiconductor layer may be sequentially formed to cover the inner sidewall of the through-hole H having the lower semiconductor pattern LSP. The vertical insulating layer and the first semiconductor layer may be formed to partially fill the through-hole H. A sum of thicknesses of the vertical insulating layer and the first semiconductor layer may be less than a half of a width of the through-hole H. In other words, the through-hole H may not be completely filled with the vertical insulating layer and the first semiconductor layer.

The vertical insulating layer may cover the top surface of the lower semiconductor pattern LSP filling the lower region of the through-hole H. The vertical insulating layer may be formed of a plurality of thin layers. The vertical insulating layer may be deposited using a plasma-enhanced CVD technique, a physical CVD technique or an ALD technique. The vertical insulating layer may include a charge storage layer used as a memory element of a flash memory device. In some embodiments, the charge storage layer may be a trap insulating layer or an insulating layer including conductive nano dots. Alternatively, the vertical insulating layer may include a thin layer for a phase change memory device or a thin layer for a variable resistance memory device.

In some embodiments, the vertical insulating layer may include a blocking insulating layer BIL, a charge storage layer CL and a tunnel barrier layer TBL which are sequentially stacked, as illustrated in FIG. 14. The blocking insulating layer BIL may cover sidewalls of the sacrificial layers 107 and the insulating layers 110 and the top surface of the lower semiconductor pattern LSP, which are exposed by the through-hole H. The blocking insulating layer BIL may be formed of, for example, a silicon oxide layer. The charge storage layer CL may include a trap insulating layer or an insulating layer including conductive nano dots. For example, the charge storage layer CL may include at least one of a silicon nitride layer, a silicon oxynitride layer, a silicon-rich nitride layer, a nano-crystalline silicon layer and a laminated trap layer. The tunnel barrier layer TBL may include at least one of materials having an energy band gap greater than that of the charge storage layer CL. For example, the tunnel barrier layer TBL may include a silicon oxide layer.

The first semiconductor layer may be formed on the vertical insulating layer. In some embodiments, the first semiconductor layer may include a semiconductor material formed using at least one of an ALD technique or a CVD technique. For example, the first semiconductor layer may be a poly-crystalline silicon layer. In some embodiments, the first semiconductor layer may be deposited in an amorphous state and may be then crystallized using an annealing process.

The first semiconductor layer and the vertical insulating layer on the top surface of the lower semiconductor pattern LSP may be anisotropically etched to expose the lower semiconductor pattern LSP after the formation of the vertical insulating layer and the first semiconductor layer. Thus, the first semiconductor pattern 130 and the vertical insulator 120 may be formed on the inner sidewall of the through-hole H.

In other words, each of the vertical insulator 120 and the first semiconductor pattern 130 may be formed to have a cylindrical shape having both opened ends. The top surface of the lower semiconductor pattern LSP, which is exposed by the first semiconductor pattern 130 and the vertical insulator 120, may be recessed by over-etch during the anisotropic etching process of the first semiconductor layer and the vertical insulating layer.

A portion of the vertical insulating layer, which is disposed under the first semiconductor pattern 130, may not be etched during the anisotropic etching process. In this case, the vertical insulator 120 may have a bottom portion disposed between a bottom surface of the first semiconductor pattern 130 and the top surface of the lower semiconductor pattern LSP.

Additionally, the top surface of the thin layer structure TS may be exposed during the anisotropic etching process of the first semiconductor layer and the vertical insulating layer. Thus, the vertical insulator 120 and the first semiconductor pattern 130 may be confinedly formed in the through-hole H. The vertical insulator 120 and the first semiconductor pattern 130 may be formed in each of the through-holes H.

Referring to FIGS. 6 and 14, a second semiconductor layer 132 may be formed on the substrate 100 having the vertical insulator 120 and the first semiconductor pattern 130. The second semiconductor layer 132 may be formed to partially fill the through-hole H. In other words, the second semiconductor layer 132 may be conformally formed in the through-hole H. The second semiconductor layer 132 may cover the inner sidewall of the through-hole H and the top surface, which is exposed by the vertical insulator 120 and the first semiconductor pattern 130, of the lower semiconductor pattern LSP. The second semiconductor layer 132 may electrically connect the lower semiconductor pattern LSP to the first semiconductor pattern 130. As illustrated in FIG. 14, the second semiconductor layer 132 may have a bottom surface 132L adjacent to the first semiconductor pattern 130 and a top surface 132U opposite to the bottom surface 132L. The second semiconductor layer 132 may include a first portion 132a adjacent to the top surface 132U and a second portion 132b adjacent to the bottom surface 132L. In other words, the second portion 132b of the second semiconductor layer 132 may be disposed between the first semiconductor pattern 130 and the first portion 132a of the second semiconductor layer 132.

The second semiconductor layer 132 may include a semiconductor material formed using one of an ALD technique or a CVD technique. The second semiconductor layer 132 may be, for example, a poly-crystalline silicon layer. In some embodiments, the second semiconductor layer 132 may be deposited in an amorphous state and may be then crystallized using an annealing process.

Figure 7:
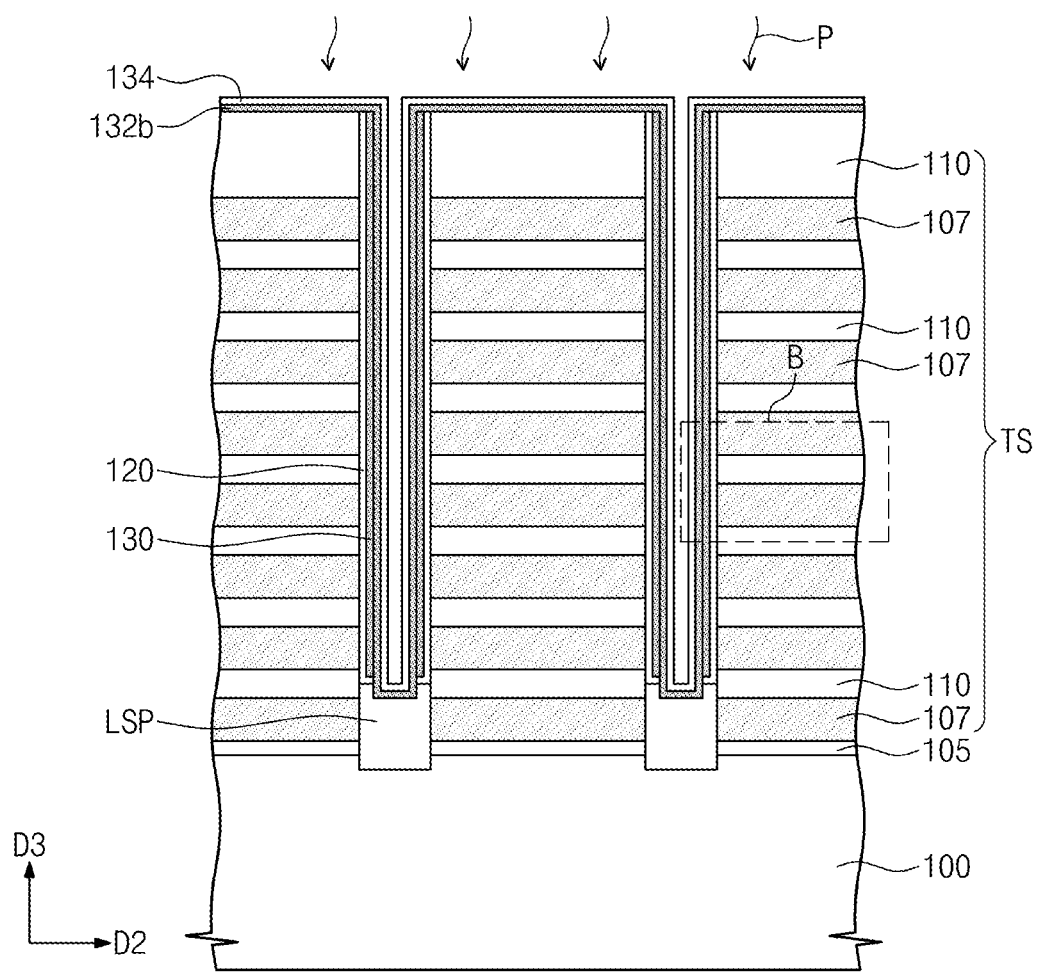

Referring to FIGS. 7 and 15, an oxidation process P may be performed on the substrate 100 having the second semiconductor layer 132. The first portion 132a of the second semiconductor layer 132 may be oxidized by the oxidation process P. The oxidized first portion 132a of the second semiconductor layer 132 may be defined as a first insulating layer 134. The first insulating layer 134 may be, for example, a silicon oxide layer.

Additionally, oxygen atoms O may be injected into the second portion 132b of the second semiconductor layer 132 and the first semiconductor pattern 130 by the oxidation process P.

Figure 16:
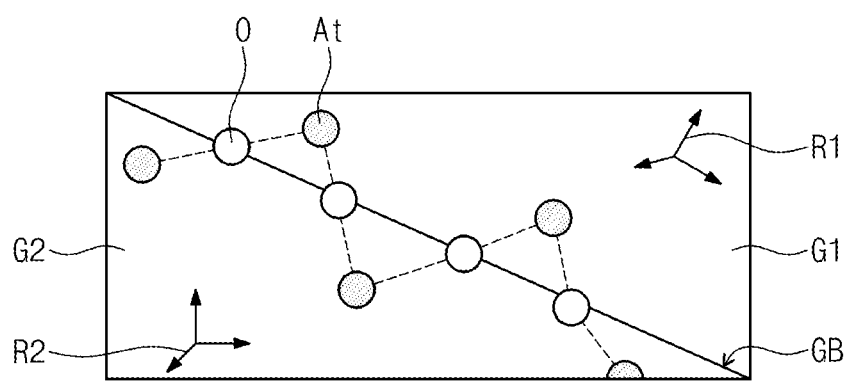
FIG. 16 is a diagram illustrating an oxygen atom injected in a grain boundary of a poly-crystalline semiconductor material according to example embodiments of the inventive concepts.

FIG. 16 is a diagram illustrating an oxygen atom injected in a grain boundary of a poly-crystalline semiconductor material according to example embodiments of the inventive concepts.

Referring to FIG. 16, the second portion 132b of the second semiconductor layer 132 and the first semiconductor pattern 130 may include the poly-crystalline semiconductor materials (e.g., poly-crystalline silicon), as described above. In other words, each of the second portion 132b of the second semiconductor layer 132 and the first semiconductor pattern 130 may include a grain boundary GB between grains G1 and G2 having different orientations R1 and R2 from each other. The oxygen atoms O may be injected into the grain boundaries GB in the second portion 132b of the second semiconductor layer 132 and the first semiconductor pattern 130, so that the oxygen atoms O may be combined with main atoms At (e.g., silicon atoms) adjacent to the grain boundaries GB. The main atoms At are atoms of the semiconductor materials of the second portion 132b of the second semiconductor layer 132 and the first semiconductor pattern 130.

Generally, defects (e.g., dangling bonds) between the main atoms At may occur in the grain boundary GB. The defects may deteriorate channel characteristics (e.g., a cell current characteristic) of a 3D semiconductor memory device.

According to embodiments of the inventive concepts, the oxygen atoms O may be injected into the grain boundaries GB of the second semiconductor layer 132 and the first semiconductor pattern 130 by the oxidation process P. Thus, the oxygen atoms O may be combined with the main atoms At (referring to FIG. 16) adjacent to the grain boundaries GB, thereby suppressing occurrence of the detects (e.g. the dangling bonds) between the main atoms At that are adjacent to each other at the grain boundaries GB. Thus, the channel characteristics (e.g., the cell current characteristic) of the 3D semiconductor memory device may be improved.

Referring again to FIGS. 7 and 15, oxidizing the first portion 132a of the second semiconductor layer 132 and injecting the oxygen atoms O may be performed at the same time by the oxidation process P.

An oxygen atomic concentration of the second portion 132b including the oxygen atoms O injected by the oxidation process P may be lower than an oxygen atomic concentration of the first insulating layer 134. In some embodiments, the oxygen atomic concentration of the second portion 132b may be in a range of about $10^{18}/cm^3$ to about $10^{20}/cm^3$. In the specification, the atomic concentration means a value obtained by multiplying Avogadro's number ($6.02 \times 10^{23}$/mol) by a value calculated by dividing a density (g/cm$^3$) by an atomic weight (g/mol). An oxygen atomic concentration of the first semiconductor pattern 130 including the oxygen atoms O injected by the oxidation process P may also be lower than the oxygen atomic concentration of the first insulating layer 134. In some embodiments, the oxygen atomic concentration of the first semiconductor pattern 130 may be substantially equal to the oxygen atomic concentration of the second portion 132b.

Each of the second portion 132b and the first semiconductor pattern 130 that include the oxygen atoms O injected by the oxidation process P may have a higher electrical conductivity than the first insulating layer 134. Thus, the second portion 132b and the first semiconductor pattern 130 may be used as a channel region of the 3D semiconductor memory device according to embodiments of the inventive concepts.

In some embodiments, the oxidation process P may be a radical oxidation process performed at a temperature in a range of about 600° C. to about 1000° C., or a wet oxidation process performed at a temperature in a range of about 800° C. to about 1000° C.

Figure 8:
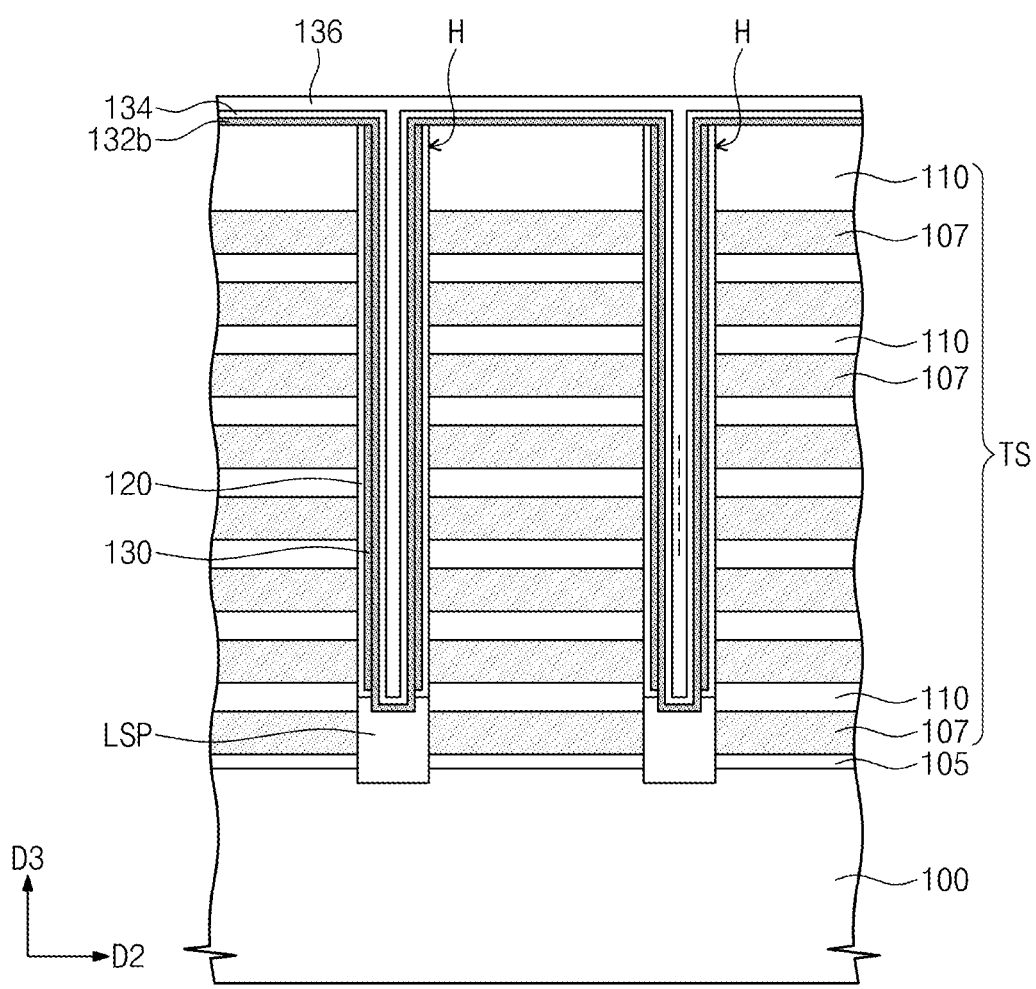

Referring to FIG. 8, a second insulating layer 136 may be formed on the substrate 100 after the formation of the first insulating layer 134. The second insulating layer 136 may be formed to completely fill the through-hole H. The second insulating layer 136 may include at least one of insulating materials and silicon oxide that are formed using a spin-on-glass (SOG) technique.

Figure 9:
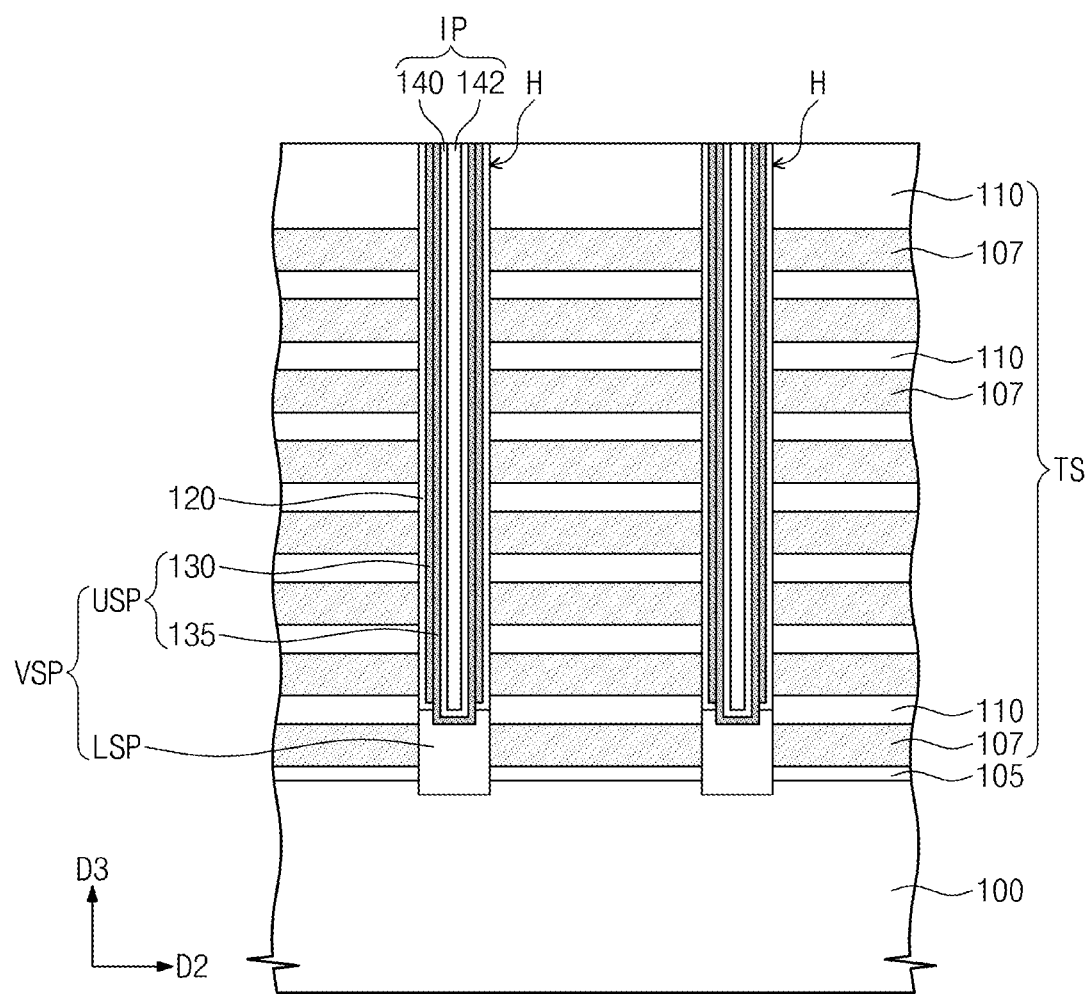

Referring to FIG. 9, the second insulating layer 136, the first insulating layer 134 and the second portion 132b of the second semiconductor layer 132 may be planarized to form a second semiconductor pattern 135, a first insulating pattern 140 and a second insulating pattern 142 in the through-hole H at the same time. The second semiconductor pattern 135, the first insulating pattern 140 and the second insulating pattern 142 may be locally formed in the through-hole H by the planarization process.

The second semiconductor pattern 135 may be formed to have a pipe-shape having one closed end, a hollow cylindrical shape having one closed end or a cup-shape in the through-hole H.

The first insulating pattern 140 may be formed to partially fill the through-hole H in which the second semiconductor pattern 135 is formed. The first insulating pattern 140 may be formed to have a pipe-shape having one closed end, a hollow cylindrical shape having one closed end or a cup-shape in the through-hole H. The second insulating pattern 142 may be formed to fill the through-hole H in which the first insulating pattern 140 is formed.

The first and second semiconductor patterns 130 and 135 may be defined as an upper semiconductor pattern USP. The upper semiconductor pattern USP may be formed on the lower semiconductor pattern LSP. The upper and lower semiconductor patterns USP and LSP may be defined as a vertical semiconductor pattern VSP. The first and second insulating patterns 140 and 142 may be defined as a filling insulating pattern IP. The upper semiconductor pattern USP and the filling insulating pattern IP may fill an upper region of the through-hole H.

Figure 10:
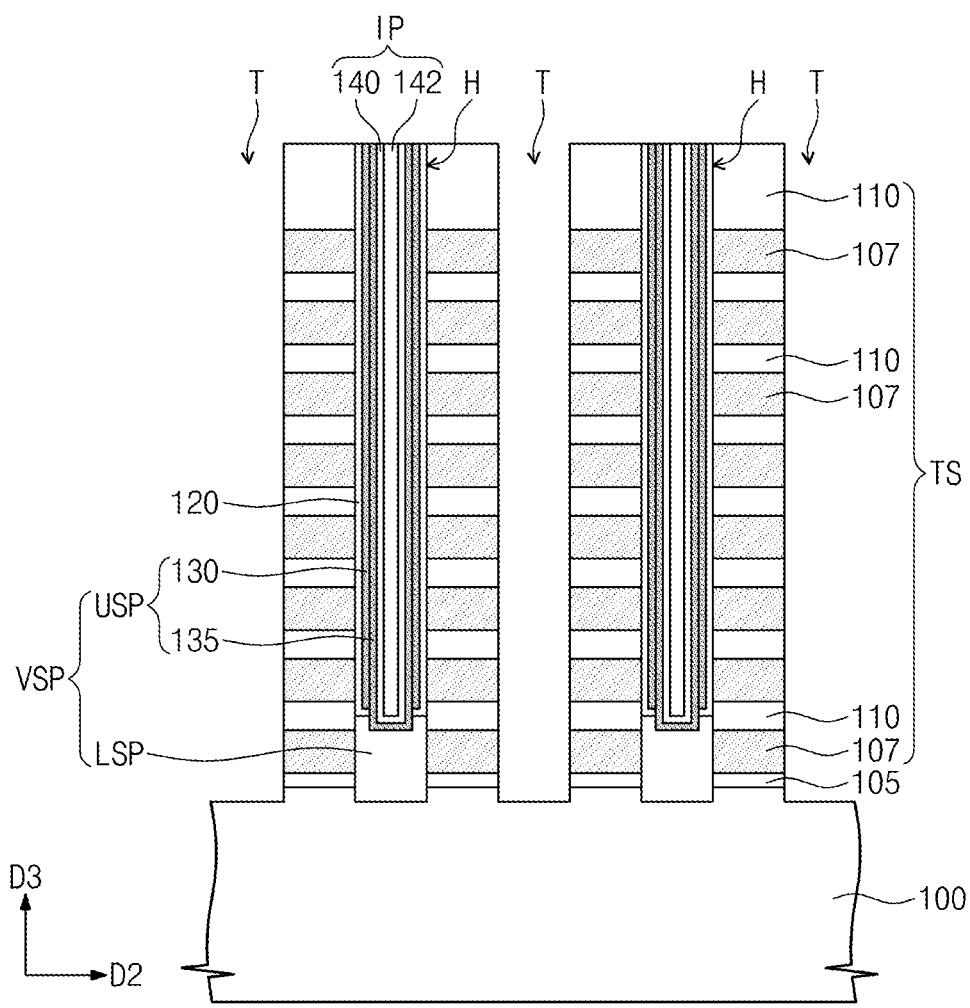

Referring to FIG. 10, the thin layer structure TS may be patterned to form a trench T between adjacent through-holes H. The trench T may expose the substrate 100.

In more detail, a second mask pattern (not shown) defining a planar position of the trench T may be formed on the thin layer structure TS, and the thin layer structure TS may be then anisotropically etched using the second mask pattern as an etch mask to form the trench T.

The trench T may be laterally spaced apart from the upper and lower semiconductor patterns USP and LSP and may expose sidewalls of the sacrificial layers 107 and the insulating layers 110. The trench T may have a linear shape or a rectangular shape when viewed from a plan view. The trench T may be formed to expose the top surface of the substrate 100 when viewed from a cross-sectional view. The top surface of the substrate 100 may be recessed by over-etch during the etching process of forming the trench T.

Due to the anisotropic etching process of forming the trench T, a width of the trench T may be varied as a distance from the substrate 100 becomes varied. In some embodiments, a width of a lower part of the trench T may be less than a width of an upper part of the trench T.

Since the trench T is formed, the thin layer structure TS may be formed to have a linear shape extending in one direction. A plurality of the vertical semiconductor patterns VSP may penetrate one thin layer structure TS having the linear shape.

Figure 11:
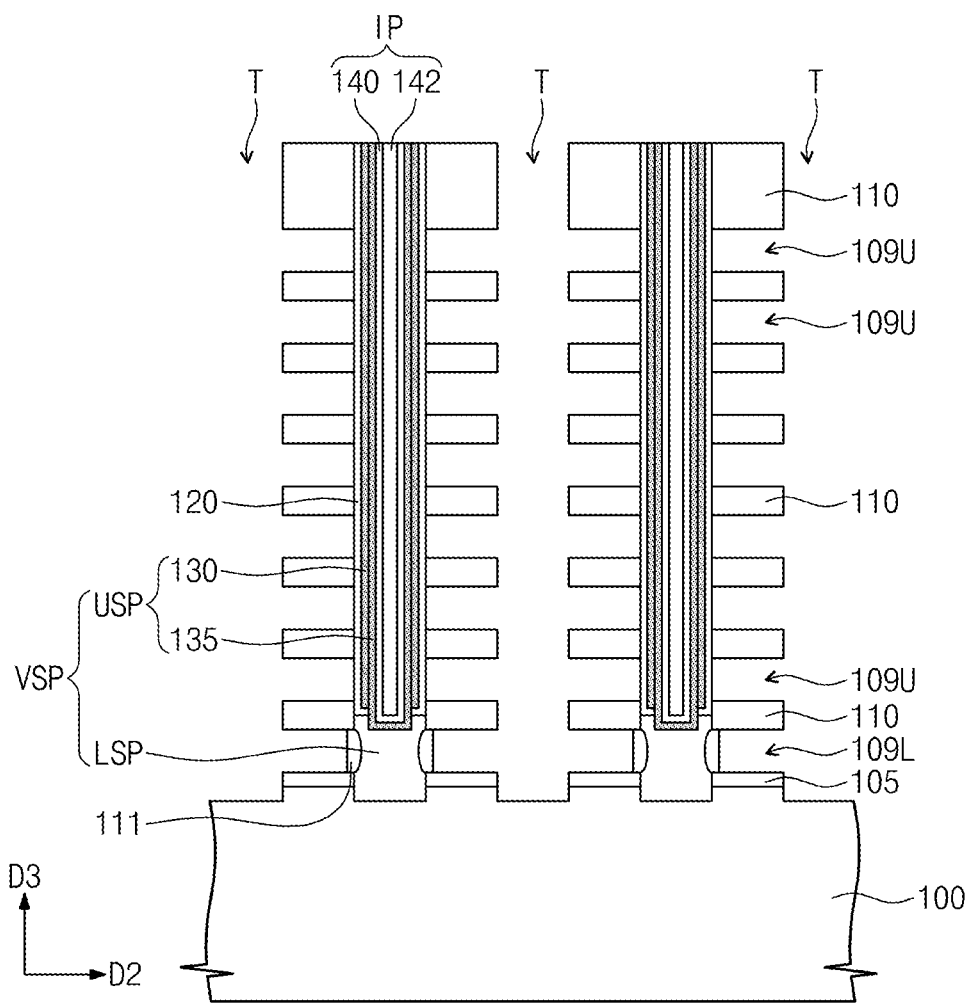

Referring to FIG. 11, the sacrificial layers 107 exposed by the trench T may be removed to form lower and upper recess regions 109L and 109U between the insulating layers 110.

In more detail, the sacrificial layers 107 may be isotropically etched using an etch recipe having an etch selectivity with respect to the insulating layers 110, the vertical insulator 120, the lower semiconductor pattern LSP, the lower insulating layer 105 and the substrate 100, thereby forming the lower and upper recess regions 109L and 109U. The sacrificial layers 107 may be completely removed by the isotropic etching process. In some embodiments, if the sacrificial layers 107 are silicon nitride layers and the insulating layers 110 are silicon oxide layer, the isotropic etching process may be performed using an etching solution including phosphoric acid.

The lower recess region 109L may laterally extend from the trench T between the lower insulating layer 105 and the lowermost insulating layer 110 and may expose a portion of a sidewall of the lower semiconductor pattern LSP. The upper recess regions 109U may laterally extend from the trench T between the insulating layers 110 and may expose portions of a sidewall of the vertical insulator 120, respectively. In other words, the lower recess region 109L may be defined by the insulating layers 110 and 105 vertically adjacent to each other and the portion of the sidewall of the lower semiconductor pattern LSP. Each of the upper recess regions 109U may be defined by the insulating layers 110 vertically adjacent to each other and the portion of the sidewall of the vertical insulator 120.

Vertical heights of the lower and upper recess regions 109L and 109U may be substantially equal to the thicknesses of the sacrificial layers 107. In some embodiments, the vertical height of the lower recess region 109L may be greater than the vertical heights of the upper recess regions 109U. Alternatively, the vertical heights of the lower and upper recess regions 109L and 109U may be substantially equal to each other.

A gate dielectric pattern 111 may be formed in the lower recess region 109L after the formation of the recess regions 109U and 109L. Forming the gate dielectric pattern 111 may include performing a thermal oxidation process to oxidize the portion, which is exposed by the lower recess region 109L, of the sidewall of the lower semiconductor pattern LSP. The exposed portion of the sidewall of the lower semiconductor pattern LSP may be consumed by the oxidation process of forming the gate dielectric pattern 111. The gate dielectric pattern 111 may include, for example, silicon oxide.

Figure 12:
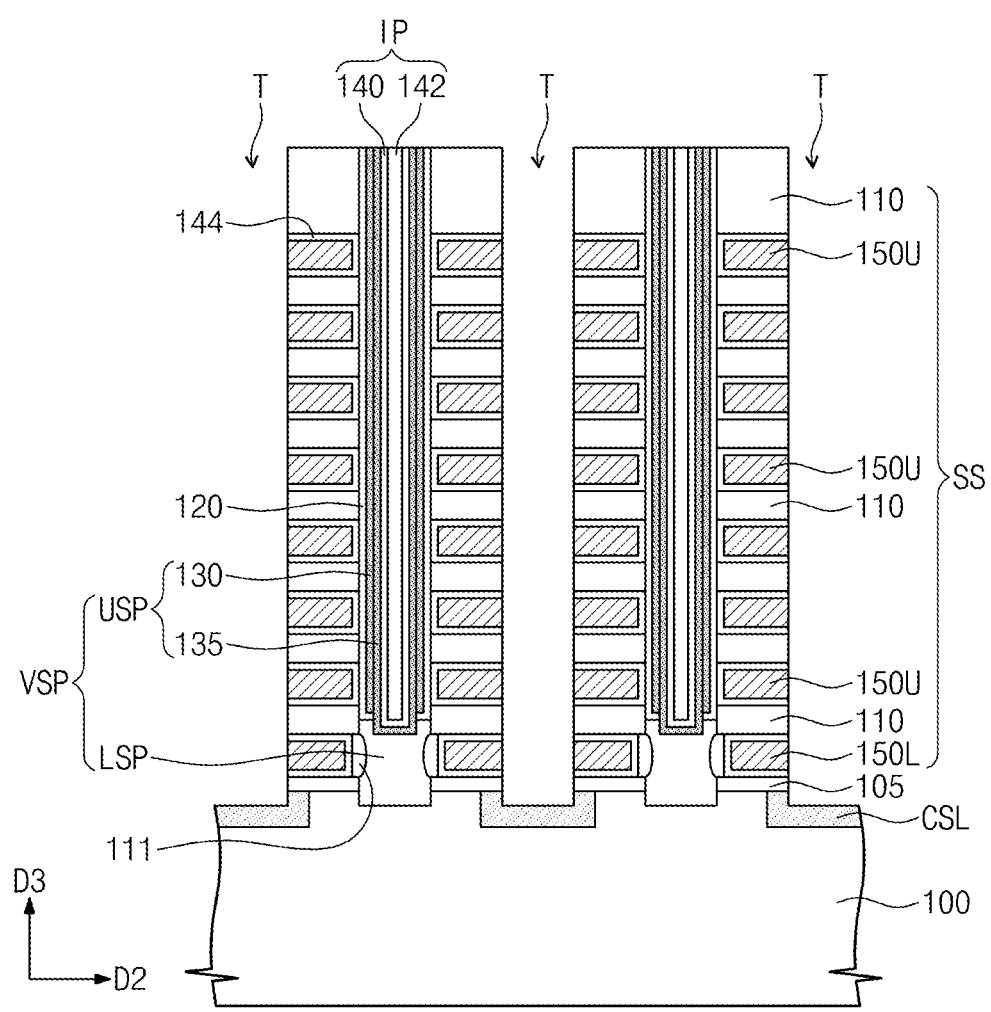

Referring to FIG. 12, horizontal insulators 144 and gate electrodes 150L and 150U may be formed in the recess regions 109L and 109U. The horizontal insulators 144 may cover inner surfaces of the lower and upper recess regions 109L and 109U, respectively. Lower and upper gate electrodes 150L and 150U may fill the rest spaces of the lower and upper recess regions 109L and 109U, respectively.

In more detail, a horizontal insulating layer and a conductive layer may be sequentially formed in the recess regions 109L and 109U and the trench T, and the horizontal insulating layer and the conductive layer outside the recess regions 109L and 109U may be then removed to locally form the horizontal insulators 144 and the lower and upper gate electrodes 150L and 150U in the lower and upper recess regions 109L and 109U.

The horizontal insulating layer may consist of a single-thin layer or a plurality of thin layers, like the vertical insulating layer. In some embodiments, the horizontal insulating layer may include a blocking insulating layer of a trap-type flash memory transistor. In this case, the blocking insulating layer BIL included in the vertical insulating layer may be a first blocking insulating layer, and the blocking insulating layer included in the horizontal insulating layer may be a second blocking insulating layer. The second blocking insulating layer may have a dielectric constant greater than that of the tunnel barrier layer TBL described with reference to FIG. 14. Additionally, the second blocking insulating layer may have an energy band gap that is less than that of the tunnel barrier layer TBL of FIG. 14 and is greater than that of the charge storage layer CL of FIG. 14. For example, the second blocking insulating layer may include at least one of high-k dielectric layers such as an aluminum oxide layer and a hafnium oxide layer.

The conductive layer may fill the lower and upper recess regions 109L and 109U and may be conformally formed on an inner surface of the trench T. In this case, forming the lower and upper gate electrodes 150L and 150U may include removing the conductive layer disposed in the trench T by an isotropic etching process. Alternatively, the conductive layer may be formed to fill the trench T. In this case, forming the lower and upper gate electrodes 150L and 150U may include removing the conductive layer disposed in the trench T by an anisotropic etching process. In some embodiments, the upper gate electrodes 150U may be formed in the upper recess regions 109U, and the lower gate electrode 150L may be formed in the lower recess region 109L. In some embodiments, the conductive layer may include a barrier metal layer and a metal layer which are sequentially deposited. For example, the barrier metal layer may be formed of a metal nitride layer such as a titanium nitride (TiN) layer, a tantalum nitride (TaN) layer or a tungsten nitride (WN) layer. For example, the metal layer may include a metal material such as tungsten (W), aluminum (Al), titanium (Ti), tantalum (Ta), cobalt (Co) or copper (Cu).

In some embodiments, the horizontal insulators 144 may be in direct contact with the vertical insulator 120 in the upper recess regions 109U. In the lower recess region 109L, the horizontal insulator 144 may be in direct contact with the gate dielectric pattern 111 on the sidewall of the lower semiconductor pattern LSP. The lower and upper gate electrodes 150L and 150U and the insulating layers 110 therebetween may be defined as a stack structure SS.

After the formation of the lower and upper gate electrodes 150L and 150U, a common source region CSL may be formed in the substrate 100. The common source region CSL may be formed by performing an ion implantation process on the substrate 100 exposed by the trench T. The common source region CSL may have a different conductivity type from the lower semiconductor pattern LSP. A portion of the substrate 100, which is in contact with the lower semiconductor pattern LSP, may have the same conductivity type as the lower semiconductor pattern LSP. According to some embodiments of the inventive concepts for a flash memory device, a plurality of common source regions CSL may be connected to each other to be in an equipotential state. In other embodiments, the plurality of common source regions CSL may be electrically separated from each other to have different potentials from each other. In still other embodiments, the plurality of common source regions CSL may be divided into a plurality of source groups. Each of the source groups may include a plurality of common source regions CSL. The source groups may be electrically separated from each other to have different potentials from each other.

Figure 13:
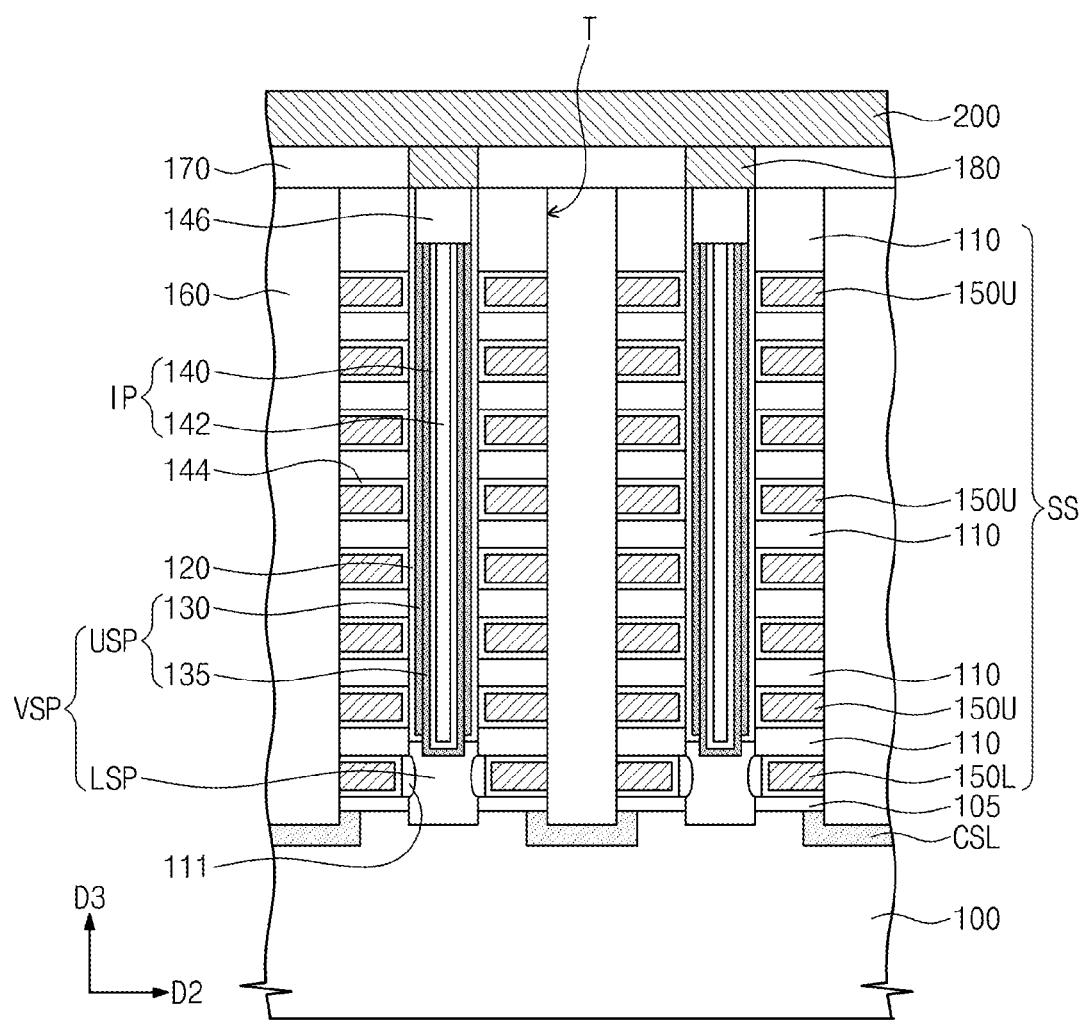

Referring to FIG. 13, an electrode isolation pattern 160 may be formed to fill the trench T on the common source region CSL. The electrode isolation pattern 160 may be formed of at least one of a silicon oxide layer, a silicon nitride layer and a silicon oxynitride layer.

A conductive pad 146 may be formed to be connected to the first and second semiconductor patterns 130 and 135 in each through-hole H. Upper portions of the first and second semiconductor patterns 130 and 135 may be recessed, and then the recessed region may be filled with a conductive material to form the conductive pad 146. In some embodiments, the conductive pad 146 may be doped with dopants of a conductivity type different from that of the first and second semiconductor patterns 130 and 135. Thus, the conductive pad 146 may constitute a diode along with the first and second semiconductor patterns 130 and 135 under the conductive pad 146.

A contact plug 180 and a bit line 200 may be formed on the stack structure SS. The contact plug 180 may be connected to the conductive pad 146, and the bit line 200 may be connected to the contact plug 180. The bit line 200 may be electrically connected to the first and second semiconductor patterns 130 and 135 through the contact plug 180 and the conductive pad 146. The bit line 200 may cross over the lower and upper gate electrodes 150L and 150U and the trench T. The bit line 200 may be spaced apart from the stack structure SS by an interlayer insulating layer 170.

FIG. 17 is a perspective view illustrating a three-dimensional semiconductor memory device according to example embodiments of the inventive concepts. Hereinafter, structural features of the 3D semiconductor memory device according to example embodiments will be described with reference to FIGS. 13 and 17.

Referring to FIGS. 13 and 17, a stack structure SS may be disposed on a substrate 100. The stack structure SS may include insulating layers 110 and gate electrodes that are alternately and repeated stacked on the substrate 100. The gate electrodes may include a lower gate electrode 150L on the substrate 100 and upper gate electrodes 150U stacked on the lower gate electrode 150L.

The stack structure SS may have a linear shape extending a first direction D1 when viewed from a plan view. Common source regions CSL may be disposed in the substrate 100 at both sides of the stack structure SS. A lower insulating layer 105 may be disposed between the substrate 100 and the stack structure SS. The lower insulating layer 105 may be, for example, a silicon oxide layer. The lower insulating layer 105 may be thinner than the insulating layers 110.

A plurality of vertical semiconductor patterns VSP may penetrate the stack structure SS and may be connected to the substrate 100. The vertical semiconductor patterns VSP may be arranged in the first direction D1 when viewed from a plan view, as illustrated in FIG. 17. Alternatively, the vertical semiconductor patterns VSP may be arranged in a zigzag form along the first direction D1 when viewed from a plan view.

Each of the vertical semiconductor patterns VSP may include a lower semiconductor pattern LSP penetrating a lower portion of the stack structure SS and an upper semiconductor pattern USP penetrating an upper portion of the stack structure SS. The upper semiconductor pattern USP is connected to the lower semiconductor pattern LSP.

The upper semiconductor pattern USP may have a hollow pipe-shape or macaroni-shape. A bottom end of the upper semiconductor pattern USP may be in a closed state. An inner space of the upper semiconductor pattern USP may be filled with a filling insulating pattern IP. A bottom surface of the upper semiconductor pattern USP may be disposed at a level lower than a top surface of the lower semiconductor pattern LSP. In other words, a bottom portion of the upper semiconductor pattern USP may be surrounded by the lower semiconductor pattern LSP.

In more detail, the upper semiconductor pattern USP may include a first semiconductor pattern 130 and a second semiconductor pattern 135. The first semiconductor pattern 130 may cover an inner sidewall of the stack structure SS. The first semiconductor pattern 130 may have a pipe-shape or macaroni-shape having opened top and bottom ends. The first semiconductor pattern 130 may not be in contact with the lower semiconductor pattern LSP and may be spaced apart from the lower semiconductor pattern LSP. The second semiconductor pattern 135 may have a pipe-shape or macaroni-shape having a closed bottom end. An inner space of the second semiconductor pattern 135 may be filled with the filling insulating pattern IP. The second semiconductor pattern 135 may be in contact with an inner sidewall of the first semiconductor pattern 130 and an upper portion of the lower semiconductor pattern LSP. A bottom surface of the second semiconductor pattern 135 may be disposed at a height lower than the top surface of the lower semiconductor pattern LSP. The second semiconductor pattern 135 may electrically connect the first semiconductor pattern 130 to the lower semiconductor pattern LSP.

Each of the first and second semiconductor patterns 130 and 135 may include the poly-crystalline semiconductor material (e.g., poly-crystalline silicon) including oxygen atoms O, as described with reference to FIGS. 15 and 16. In more detail, each of the first and second semiconductor pattern 130 and 135 may include the grain boundary GB between grains G1 and G2 having different orientations R1 and R2 from each other. The oxygen atoms O may be injected into the grain boundary GB, so that they may be combined with main atoms At (e.g., silicon atoms) adjacent to the grain boundary GB. An oxygen atomic concentration of the first semiconductor pattern 130 may be substantially equal to an oxygen atomic concentration of the second semiconductor pattern 135.

The filling insulating pattern IP may include a first insulating pattern 140 and a second insulating pattern 142. The first insulating pattern 140 may partially fill the inner space of the second semiconductor pattern 135. The first insulating pattern 140 may have a pipe-shape or macaroni-shape having a closed bottom end. An inner space of the first insulating pattern 140 may be filled with the second insulating pattern 142. The first insulating pattern 140 may be in contact with a bottom surface and an inner sidewall of the inner space of the second semiconductor pattern 135.

In some embodiments, the first insulating pattern 140 may include an oxide formed by oxidizing a semiconductor material. The oxygen atomic concentration of the first semiconductor pattern 130 may be lower than an oxygen atomic concentration of the first insulating pattern 140. The oxygen atomic concentration of the second semiconductor pattern 135 may also be lower than the oxygen atomic concentration of the first insulating pattern 140. Additionally, each of the first and second semiconductor patterns 130 and 135 may have a higher electrical conductivity than the first insulating pattern 140. The first and second semiconductor patterns 130 and 135 may be used as a channel region of the 3D semiconductor memory device according to embodiments of the inventive concepts.

The lower semiconductor pattern LSP may be formed of a semiconductor material having the same conductivity type as the substrate 100. In some embodiments, the lower semiconductor pattern LSP may be an epitaxial pattern formed using the substrate 100 as a seed. In this case, the lower semiconductor pattern LSP may include a single-crystalline or poly-crystalline semiconductor material.

The stack structure SS will be described in more detail. The stack structure SS may include the lower gate electrode 150L adjacent to the lower semiconductor pattern LSP, and the upper gate electrodes 150U adjacent to the upper semiconductor pattern USP. The lower gate electrode 150L and the upper gate electrodes 150U may be stacked along a third direction D3 perpendicular to both the first direction D1 and a second direction D2 intersecting the first direction D1. The stacked gate electrodes 150U and 150L may be separated from each other by the insulating layers 110 disposed between the gate electrodes 150U and 150L.

In some embodiments, the lower gate electrode 150L may be used as the gate electrode of the ground selection transistor GST described with reference to FIG. 1. In other words, the lower gate electrode 150L may be used as the gate electrode of the ground selection transistor GST that controls electrical connection between the common source region CSL formed in the substrate 100 and the lower semiconductor pattern LSP in a 3D NAND flash memory device. Some of the upper gate electrodes 150U may be used as the gate electrodes of the memory cell transistors MCT described with reference to FIG. 1. Additionally, the uppermost one of the upper gate electrodes 150U may be used as the gate electrode of the string selection transistor SST describe with reference to FIG. 1. In other words, the uppermost one of the upper gate electrodes 150U may be used as the gate electrode of the string selection transistor SST that controls electrical connection between a bit line 200 and the vertical semiconductor pattern VSP in the 3D NAND flash memory device.

At least a portion of the insulating layer 110 adjacent to the lower semiconductor pattern LSP may be in direct contact with a portion of the sidewall of the lower semiconductor pattern LSP. In other words, at least a portion of the top surface of the lower semiconductor pattern LSP may be higher than a top surface of the lower gate electrode 150L. A gate dielectric pattern 111 may be disposed between the lower semiconductor pattern LSP and the lower gate electrode 150L. The gate dielectric pattern 111 may include, for example, silicon oxide.

A vertical insulator 120 may be disposed between the upper semiconductor pattern USP and the stack structure SS. The vertical insulator 120 may have a pipe-shape or macaroni-shape having opened top and bottom ends. A bottom surface of the vertical insulator 120 may be in contact with a portion of the top surface of the lower semiconductor pattern LSP. The vertical insulator 120 may include a memory element of a flash memory device. In other words, the vertical insulator 120 may include the charge storage layer CL of the flash memory device, as illustrated in FIG. 14. Data stored in the vertical insulator 120 may be changed using Fowler-Nordheim tunneling caused by a voltage difference between the upper semiconductor pattern USP and the upper gate electrode 150U. Alternatively, the vertical insulator 120 may include a thin layer capable of storing data based on another operation principle (e.g., a thin layer for a phase change memory device or a thin layer for a variable resistance memory device).

In some embodiments, the vertical insulator 120 may include the charge storage layer CL and a tunnel barrier layer TBL that are sequentially stacked, as illustrated in FIG. 14. The tunnel barrier layer TBL may be in direct contact with the upper semiconductor pattern USP, and the charge storage layer CL may be disposed between the tunnel barrier layer TBL and the upper gate electrodes 150U. In other embodiments, the vertical insulator 120 may further include a blocking insulating layer BIL disposed between the charge storage layer CL and the upper gate electrodes 150U.

For example, the charge storage layer CL may include at least one of a silicon nitride layer, a silicon oxynitride layer, a silicon-rich nitride layer, a nano-crystalline silicon layer and a laminated trap layer. The tunnel barrier layer TBL may include a material having an energy band gap greater than that of the charge storage layer CL. For example, the tunnel barrier layer TBL may include a silicon oxide layer. The blocking insulating layer BIL may include a material having an energy band gap greater than that of the charge storage layer CL. For example, the blocking insulating layer BIL may include at least one of a silicon oxide layer, a silicon nitride layer and a silicon oxynitride layer.

Even though not shown in the drawings, the vertical insulator 120 may include a capping layer (not shown) disposed between the upper semiconductor pattern USP and the insulating layers 110. The capping layer may be in direct contact with the insulating layers 110 and may be vertically separated by the upper gate electrodes 150U. In other embodiments, the capping layer may vertically extend between the upper semiconductor pattern USP and the upper gate electrodes 150U. The capping layer may include an insulating material that has an etch selectivity with respect to the charge storage layer CL and is different from the insulating layers 110. For example, the capping layer may include at least one of a silicon layer, a silicon oxide layer, a poly-silicon layer, a silicon carbide layer and a silicon nitride layer and may include a different insulating material from the insulating layers 110. In still other embodiments, the capping layer may include at least one of high-k dielectric layers such as a tantalum oxide ($Ta_2O_5$) layer, a titanium oxide ($TiO_2$) layer, a hafnium oxide ($HfO_2$) layer and a zirconium oxide ($ZrO_2$) layer.

A horizontal insulator 144 may be disposed on top and bottom surfaces of each gate electrodes 150L and 150U. The horizontal insulator 144 adjacent to each upper gate electrode 150U may extend between the vertical insulator 120 and each upper gate electrode 150U. The horizontal insulator 144 adjacent to the lower gate electrode 150L may extend between the lower gate electrode 150L and the gate dielectric pattern 111. Each of the horizontal insulators 144 may consist of a single-thin layer or a plurality of thin layers. In some embodiments, the horizontal insulator 144 may include at least a portion of a blocking insulating layer of a charge trap-type flash memory transistor.

A conductive pad 146 may penetrate the stack structure SS and may be connected to the upper semiconductor pattern USP. A top surface of the conductive pad 146 may be substantially coplanar with the top surface of the stack structure SS. A bottom surface of the conductive pad 146 may be in direct contact with the upper semiconductor pattern USP. The vertical insulator 120 may also be disposed between the conductive pad 146 and the insulating layer 110 adjacent to the conductive pad 146. The conductive pad 146 may be a dopant region doped with dopants or may include a conductive material.

Electrode isolation patterns 160 may be disposed at both sides of the stack structure SS. The electrode isolation patterns 160 may cover the common source regions CSL. A bit line 200 may cross over the stack structure SS. The bit line 200 may be connected to the conductive pad 146 through a contact plug 180. The bit line 200 may be spaced apart from the stack structure SS by an interlayer insulating layer 170.

According to embodiments of the inventive concepts, the oxidation process P may be performed on the second semiconductor layer 132 including the poly-crystalline semiconductor material. Thus, the first portion 132a of the second semiconductor layer 132 may be oxidized to form the first insulating layer 134, and at the same time, the oxygen atoms O may be injected into the second portion 132b of the second semiconductor layer 132. The oxygen atoms O may be injected to the grain boundary GB in the second portion 132b. The oxygen atoms O may be combined with the main atoms At of the semiconductor material adjacent to the grain boundary GB, thereby reducing defects (e.g., dangling bonds between the main atoms At) caused at the grain boundary GB. Thus, it is possible to provide the 3D semiconductor memory device having improved channel characteristics (e.g., an improved cell current characteristic).

Figure 18:
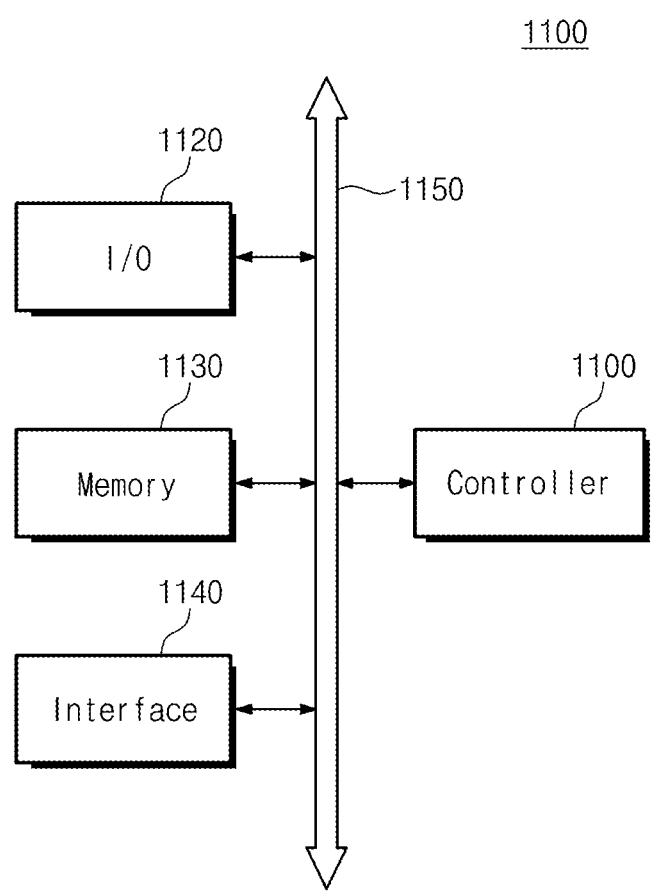
FIG. 18 is a schematic block diagram illustrating an example of a memory system including a three-dimensional semiconductor memory device according to example embodiments of the inventive concepts.

FIG. 18 is a schematic block diagram illustrating an example of a memory system including a three-dimensional semiconductor memory device according to example embodiments of the inventive concepts.

Referring to FIG. 18, a memory system 1100 may be applied to a personal digital assistant (PDA), a portable computer, a web tablet, a wireless phone, a mobile phone, a digital music player, a memory card, or other electronic products receiving and/or transmitting information data by wireless.

The memory system 1100 may include a controller 1110, an input/output (I/O) 1120 (e.g., a keypad, a keyboard, and/or a display), a memory 1130, an interface 1140 and a data bus 1150. The memory device 1130 and the interface unit 1140 may communicate with each other through the data bus 1150.

The controller 1110 may include at least one of a microprocessor, a digital signal processor, a microcontroller, or other logic device having a similar function to any one thereof. The memory device 1130 may store data processed by the controller 1110. The I/O unit 1120 may receive data or signals from the outside of the memory system 1100 or may output data or signals to the outside of the memory system 1100.

The memory device 1130 may include at least one of the 3D semiconductor memory devices according to the aforementioned embodiments of the inventive concepts. Additionally, the memory device 1130 may further include at least one of another kind of a memory device, a random access volatile memory device, or other various kinds of memory devices.

The interface unit 1140 may transmit electrical data to a communication network or may receive electrical data from a communication network.

The 3D semiconductor memory devices or the memory systems according to the inventive concepts may be encapsulated using various packaging techniques. For example, 3D semiconductor memory devices or the memory systems according to the inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 19:
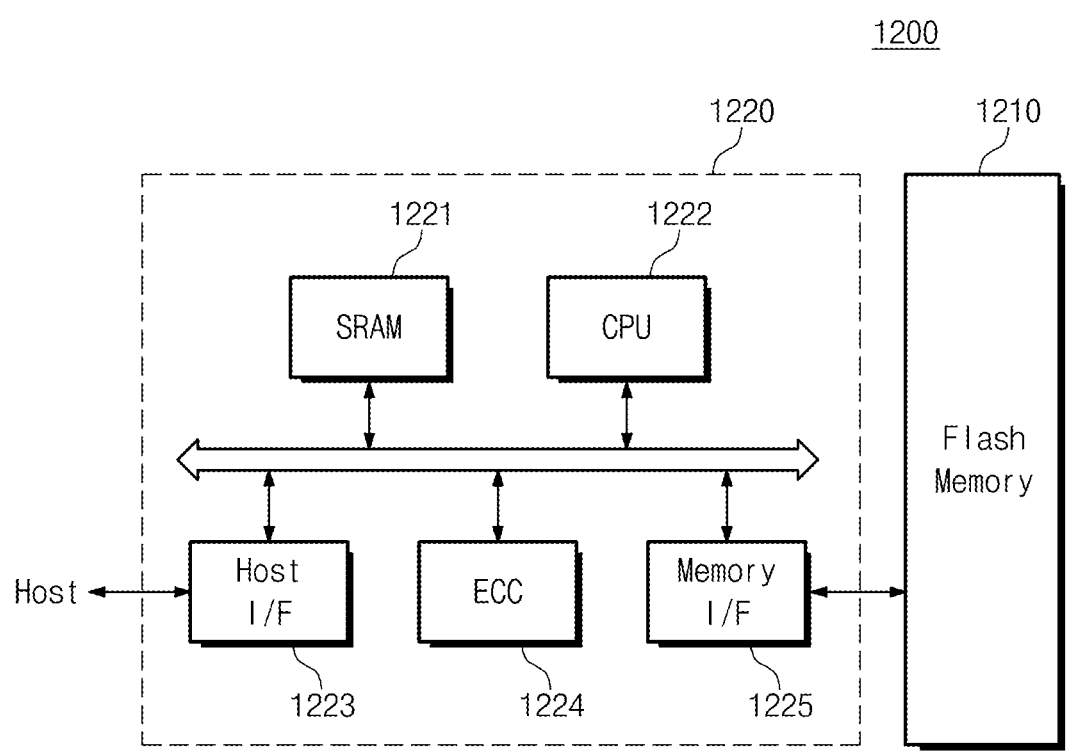
FIG. 19 is a schematic block diagram illustrating an example of a memory card including a three-dimensional semiconductor memory device according to example embodiments of the inventive concepts.

FIG. 19 is a schematic block diagram illustrating an example of a memory card including a three-dimensional semiconductor memory device according to example embodiments of the inventive concepts.

Referring to FIG. 19, a memory card 1200 may include a flash memory 1210 in order to store massive data. The flash memory 1210 may include at least one of the 3D semiconductor memory devices according to the aforementioned embodiments of the inventive concepts. The memory card 1200 may include a memory controller 1220 that controls data communication between a host and the flash memory 1210.

A static random access memory (SRAM) device 1221 may be used as an operation memory of a central processing unit (CPU) 1222. A host interface unit 1223 may be configured to include a data communication protocol between the memory system 1200 and the host. An error check and correction (ECC) 1224 may detect and correct errors of data which are read out from the flash memory 1210. A memory I/F 1225 may interface with the flash memory 1210 according to the inventive concepts. The CPU 1222 may perform overall operations for data exchange of the memory controller 1220. Even though not shown in the drawings, the memory card 1200 may further include a read only memory (ROM) device that stores code data to interface with the host.

Figure 20:
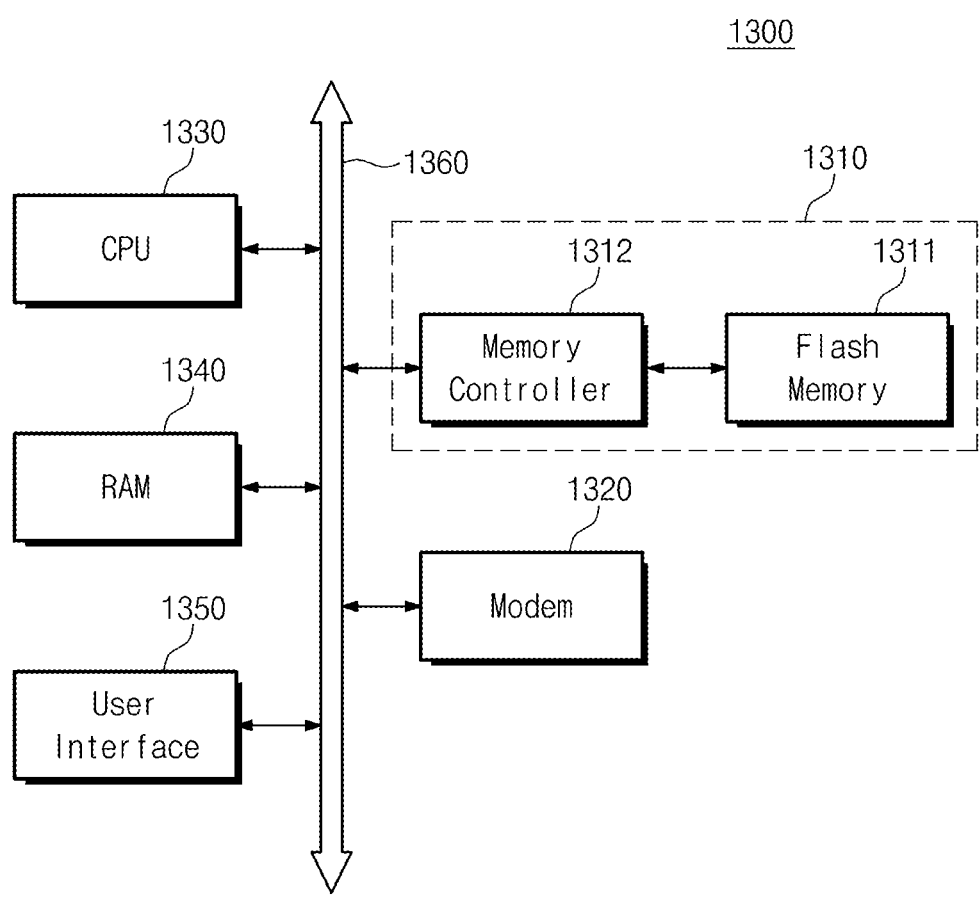
FIG. 20 is a schematic block diagram illustrating an example of an information processing system including a three-dimensional semiconductor memory device according to example embodiments of the inventive concepts.

FIG. 20 is a schematic block diagram illustrating an example of an information processing system including a three-dimensional semiconductor memory device according to example embodiments of the inventive concepts.

Referring to FIG. 20, a flash memory system 1310 may be installed in an information processing system 1300 such as a mobile device or a desk top computer. The flash memory system 1310 may include a memory controller 1312 and a flash memory 1311. The flash memory 1311 may include at least one of the 3D semiconductor memory devices according to the above embodiments of the inventive concepts. The information processing system 1300 according to the inventive concepts may include a modem 1320, a central processing unit (CPU) 1330, a random access memory (RAM) 1340 and a user interface 1350 that are electrically connected to the flash memory system 1310 through a system bus 1360. The flash memory system 1310 may be a substantially same as the aforementioned memory card. Data processed by the CPU 1330 or data inputted from the outside may be stored in the flash memory system 1310. Here, the flash memory system 1310 may be realized as a solid state disk (SSD) device. In this case, the information processing system 1300 may stably store massive data in the flash memory system 1310. Additionally, as reliability of the flash memory system 1310 may increase, the flash memory system 1310 may reduce a resource consumed for correcting errors. Even though not shown in the drawings, an application chipset, a camera image processor (CIS), and an input/output unit may further be provided in the information processing system 1300.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

SEQUENCE LIST TEXT

100: substrate
P: oxidation process
105: lower insulating layer
110: insulating layers
107: sacrificial layers
TS: thin layer structure
H: through-hole
VSP: vertical semiconductor pattern
LSP: lower semiconductor pattern
USP: upper semiconductor pattern
120: vertical insulator
130: first semiconductor pattern
132: second semiconductor layer
132a: first portion of second semiconductor layer
132b: second portion of second semiconductor layer
134: first insulating layer
O: oxygen atom
At: main atom of semiconductor material
136: second insulating layer
140, 142: insulating patterns
135: second semiconductor pattern
IP: filling insulating pattern
T: trench
144: horizontal insulators
109L, 109U: recess regions
111: gate dielectric pattern
150L, 150U: gate electrodes
SS: stack structure
CSL: common source region
180: contact plug
146: conductive pad
160: electrode isolation patterns
200: bit line

What is claimed is:

1. A method of manufacturing a semiconductor device, the method comprising:
forming a thin layer structure including insulating layers and sacrificial layers which are alternately and repeatedly stacked on a substrate;
forming a through-hole penetrating the thin layer structure and exposing the substrate;
forming a semiconductor layer covering an inner sidewall of the through-hole, the semiconductor layer partially filling the through-hole;
oxidizing a first portion of the semiconductor layer to form a first insulating layer; and
injecting oxygen atoms into a second portion of the semiconductor layer,
wherein an oxygen atomic concentration of the second portion is lower than an oxygen atomic concentration of the first insulating layer, and
wherein oxidizing the first portion and injecting the oxygen atoms into the second portion are performed using an oxidation process at the same time.

2. The method of claim 1, wherein the second portion of the semiconductor layer, which is injected with the oxygen atoms, has a higher electrical conductivity than the first insulating layer.

3. The method of claim 1, wherein the semiconductor layer includes a poly-crystalline semiconductor material, and
wherein the oxygen atoms are injected into a grain boundary of the poly-crystalline semiconductor material.

4. The method of claim 3, wherein the semiconductor layer is a poly-crystalline silicon layer, and
wherein the oxygen atoms are combined with silicon atoms at a grain boundary in the poly-crystalline silicon layer.

5. The method of claim 1, wherein the oxygen atomic concentration of the second portion is in a range of $10^{18}/cm^3$ to $10^{20}/cm^3$.

6. The method of claim 1, wherein the oxidation process is a radical oxidation process performed at a temperature in a range of 600° C. to 1000° C.

7. The method of claim 1, wherein the oxidation process is a wet oxidation process performed at a temperature in a range of 800° C. to 1000° C.

8. The method of claim 1, further comprising:
forming a first semiconductor pattern between the inner sidewall of the through-hole and the semiconductor layer;
forming a second insulating layer filling a rest region of the through-hole after performing the oxidation process; and
planarizing the second insulating layer, the first insulating layer and the second portion of the semiconductor layer to form a second semiconductor pattern, a first insulating pattern and a second insulating pattern in the through-hole at the same time.

9. The method of claim 8, further comprising:
injecting oxygen atoms into the first semiconductor pattern,
wherein injecting the oxygen atoms into the second portion of the semiconductor layer and injecting the oxygen atoms into the first semiconductor pattern are performed using the oxidation process at the same time.

10. The method of claim 9, wherein an oxygen atomic concentration of the first semiconductor pattern is lower than the oxygen atomic concentration of the first insulating layer.

11. The method of claim 10, wherein the oxygen atomic concentration of the first semiconductor pattern is substantially equal to the oxygen atomic concentration of the second portion of the semiconductor layer.

12. The method of claim 9, wherein the first semiconductor pattern injected with the oxygen atoms has a higher electrical conductivity than the first insulating layer.

13. The method of claim 9, wherein the first semiconductor pattern includes a poly-crystalline semiconductor material, and
wherein the oxygen atoms are injected into a grain boundary of the poly-crystalline semiconductor material of the first semiconductor pattern.

14. The method of claim 9, further comprising:
forming a lower semiconductor pattern filling a lower region of the through-hole,
wherein the first semiconductor pattern, the second semiconductor pattern, the first insulating pattern and the second insulating pattern are formed in an upper region of the through-hole on the lower semiconductor pattern, and
wherein the first and second semiconductor patterns are defined as an upper semiconductor pattern.

15. The method of claim 9, further comprising:
patterning the thin layer structure to form a trench that is spaced apart from the through-hole and exposes the substrate;

removing the sacrificial layers exposed by the trench to form recess regions; and forming gate electrodes in the recess regions, respectively, wherein the first and second semiconductor patterns include channel regions controlled by the gate electrodes.

* * * * *